United States Patent [19]
Umeki et al.

[11] Patent Number: 5,830,605
[45] Date of Patent: Nov. 3, 1998

[54] GRADATION MASK METHOD OF PRODUCING THE SAME AND METHOD OF FORMING SPECIAL SURFACE PROFILE ON MATERIAL USING GRADATION MASK

[75] Inventors: Kazuhiro Umeki; Shosen Sato; Masaaki Sato, all of Hanamaki, Japan

[73] Assignee: Ricoh Optical Industries Co., Ltd., Hanamaki, Japan

[21] Appl. No.: 703,539

[22] Filed: Aug. 27, 1996

[30] Foreign Application Priority Data

| | | | |
|---|---|---|---|
| Aug. 29, 1995 | [JP] | Japan | 7-220827 |
| Sep. 20, 1995 | [JP] | Japan | 7-241883 |
| Apr. 10, 1996 | [JP] | Japan | 8-088092 |

[51] Int. Cl.$^6$ .................................................. G03F 9/00
[52] U.S. Cl. ......................................... 430/5; 430/7
[58] Field of Search .................... 430/5, 7, 322, 430/323, 324

[56] References Cited

U.S. PATENT DOCUMENTS 5,547,787  8/1996  Ito et al. ..................................... 430/5
5,567,550  10/1996 Smayling ..................................... 430/5

Primary Examiner—S. Rosasco
Attorney, Agent, or Firm—Oblon, Spivak, McClelland, Maier & Neustadt, P. C.

[57] ABSTRACT

To provide a gradation mask which can easily assure distribution of desired exposure intensity.

[Means to accomplish the object] A metal and/or metallic compound film 2 (FIG. 1) is uniformly formed on a transparent substrate 1 such that they have a transmittance of 10% or less. An etching mask having a desired pattern is formed on the metal and/or metallic compound film 2. The metal and/or metallic compound film 2 is dry- or wet-etched. The metal and/or metallic compound film 2 is repeatedly subject to patterning and etching steps by using etching masks with different patterns, so that the obtained layers have a thickness Z(X, Y) varying in three or more steps in accordance with desired transmittance.

25 Claims, 11 Drawing Sheets

THICKNESS OF Cr FILM

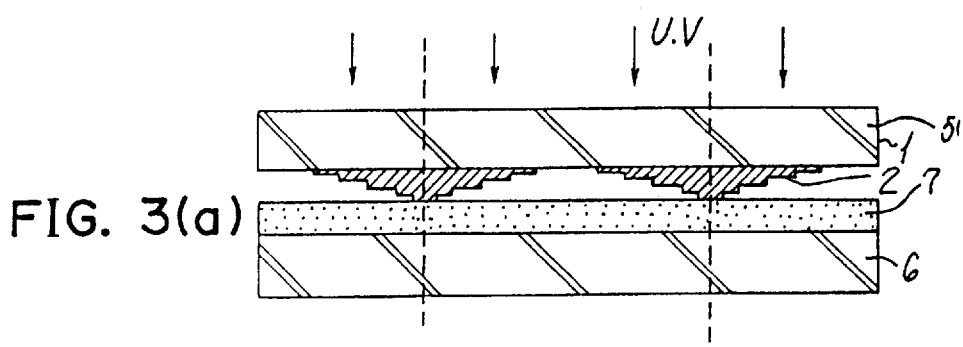
FIG. 3(a)
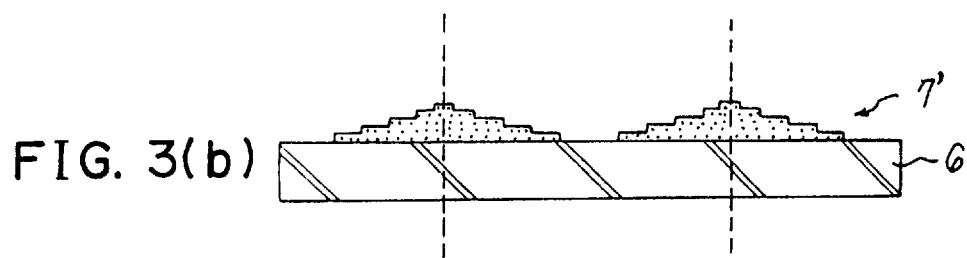
FIG. 3(b)
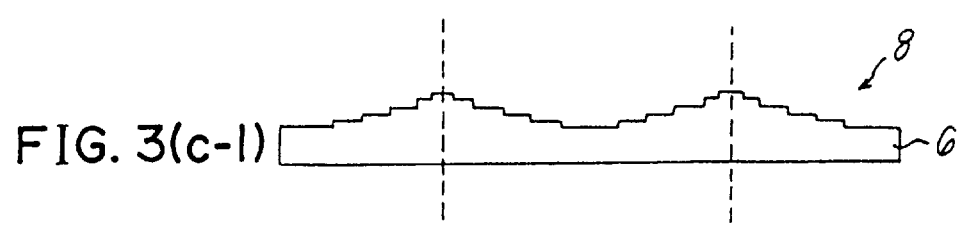
FIG. 3(c-1)
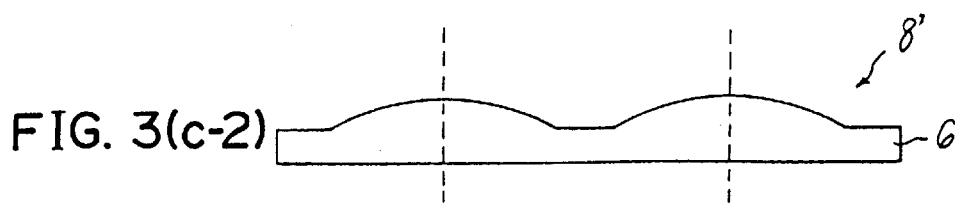
FIG. 3(c-2)

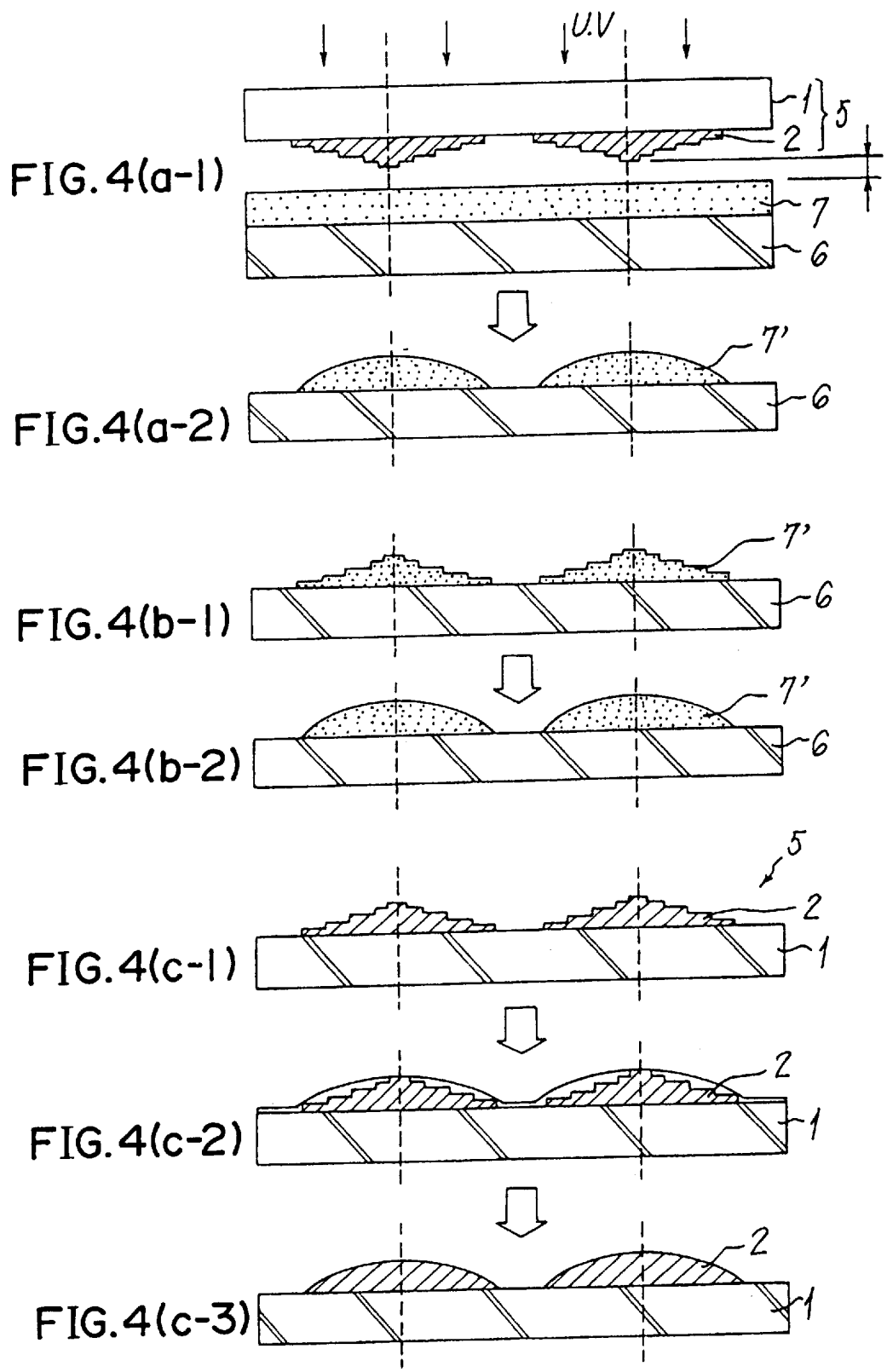

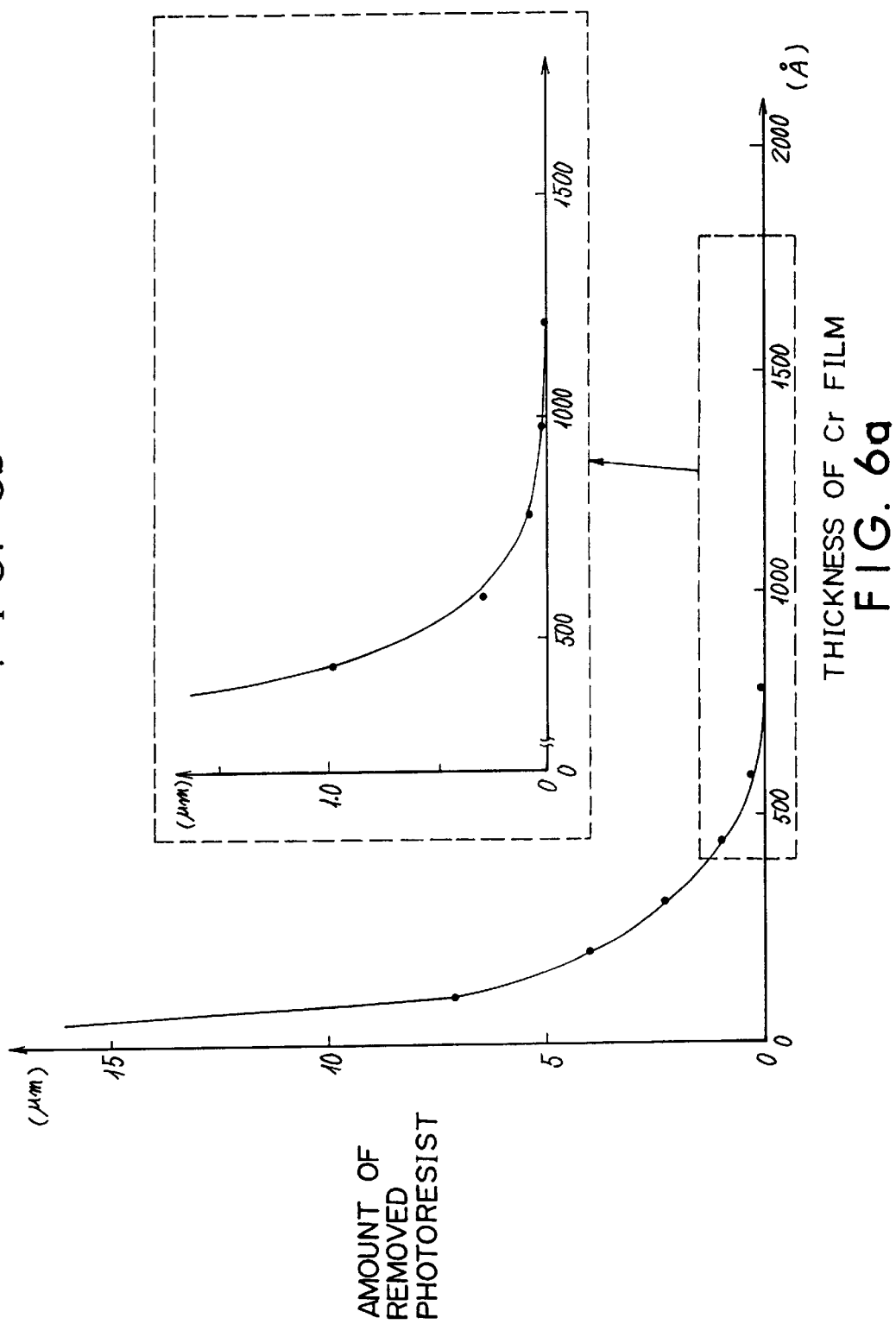

[UNIT: mm]

FIG. 11
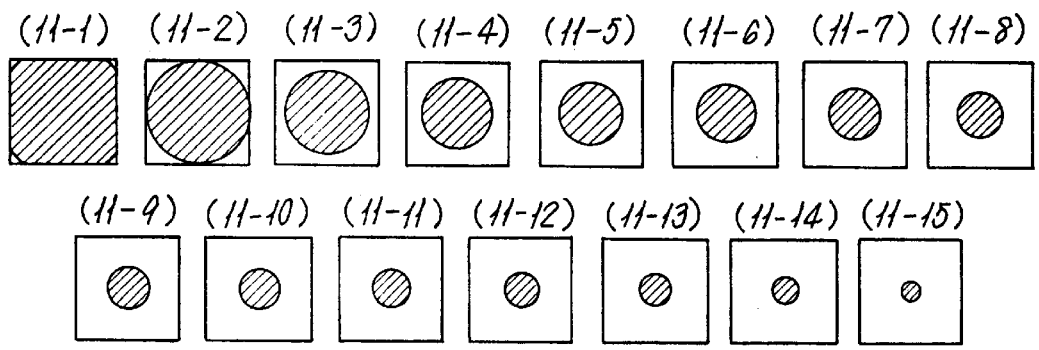
FIG. 12
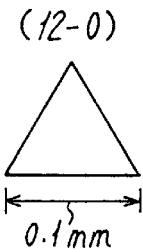
0.1mm
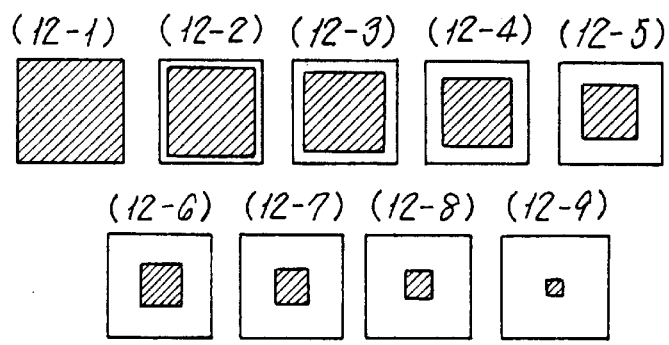

GRADATION MASK METHOD OF PRODUCING THE SAME AND METHOD OF FORMING SPECIAL SURFACE PROFILE ON MATERIAL USING GRADATION MASK

BACKGROUND OF THE INVENTION

1. Field of the Invention

This invention relates to a gradation mask, a method of producing such a gradation mask, and a method of creating special surface profiles on a material using the gradation mask.

2. Description of the Related Art

Special surface profiles such as aspherical bumps are used as refracting or reflecting surfaces of optical elements. Further, microlenses having special surface profiles are increasingly in demand for liquid crystal displays, liquid crystal projectors, and so on.

Instead of molding or grinding a refracting or reflecting surface, a method has been proposed, in which photoresist is deposited on an optical material, is two-dimensionally exposed via an exposure mask, and is developed so as to obtain a convex or concave surface profile thereon. Then, the photoresist and the optical material are subjected to an anisotropic etching process, thereby replicating the surface profile of the photoresist on the optical material. Thus, the optical material can have a surface profile which is applicable to a refracting or reflecting surface. Japanese Patent Laid-Open Publication No. Hei 5-173,003 exemplifies such a method. The publication describes an exposure mask having a circular or oval pattern.

The circular or oval pattern is projected and exposed onto photoresist in a defocused state to form a vague image, thereby varying exposure intensities from the center of the image toward peripheries thereof. Convex or concave surface profiles can be formed on the photoresist in accordance with the distribution of the exposure intensities. The distribution of exposure intensities can be varied at an exposure section in accordance with defocused levels of a projection lens.

The obtained distribution of exposure intensities is determined through the oval or circular pattern of the exposure mask and the defocused state. Thus, distributions of exposure intensities are limited to circular or oval images and the defocused vague images thereof.

The inventors have already proposed a method for producing an exposure mask having the desired two-dimensional distribution of transmittance. In the method, a two-dimensional shape of a dotted pattern and optical densities of dots are calculated so as to accomplish the desired distribution of transmittance. The dotted pattern is optically written on a photosensitive medium by an intensity variable light beam. Then, the photosensitive medium is developed, thereby obtaining an exposure mask which has the two-dimensional distribution of transmittance in accordance with the two-dimensional shape of the dotted pattern, and the optical densities of dots. This method can offer masks having desired precise patterns. However, it is necessary to use not only a computer for performing precise calculation but also an optical write unit.

In order to produce a color filter as an exposure mask having a varying transmittance, it is known to use an exposure filter in which transmittance of a chromium film is variable in ranges of 0%, 10% and 100% in accordance with a color matrix of a color filter (disclosed in Japanese Patent Laid-Open Publication No. Hei 5-011,106). However, it is very difficult to control the transmittance of the chromium film in the foregoing ranges.

SUMMARY OF THE INVENTION

It is an object of the invention to provide a gradation mask which can overcome the foregoing problems of the prior art, and can reliably and easily assure a desired distribution of exposure light intensity.

A further object of the invention is to provide a method for producing such a gradation mask.

A still further object of the invention is to provide a method of creating special surface profiles on a material assuring the gradation mask.

BRIEF DESCRIPTION OF THE DRAWINGS

FIGS. 3(*a*), 3(*b*) and 3(*c*-1) schematically show a process in which the gradation mask produced in the process shown in FIGS. 1(*a*) to 1(*g*) or FIGS. 2(*a*) to 2(*g*) is used as an exposure mask in order to obtain a micro-optical element (having step like special surface profiles);

FIG. 3(*c*-2) shows smooth convex surface profiles of the micro-optical element;

FIGS. 4(*a*-1) and 4(*a*-2) schematically show a smoothing treatment;

FIGS. 4(*b*-1) and 4(*b*-2) schematically show another smoothing treatment;

FIGS. 4(*c*-1) to 4(*c*-3) schematically show a still another smoothing treatment;

FIGS. 6A and 6B shows the relationship between the thickness of the chromium film and a thickness of removed photoresist after positive photoresist is exposed via the chromium film, developed and then rinsed;

FIG. 11 shows fifteen mask making patterns which are used in a patterning step for producing a gradation mask; and FIG. 12 shows a pyramidal profile for producing a pyramidal array and nine mask making patterns used in a patterning step for obtaining one pyramidal bump of the gradation mask.

[Legends]

1: synthetic quartz substrate

2: chromium film

Figure 1A:
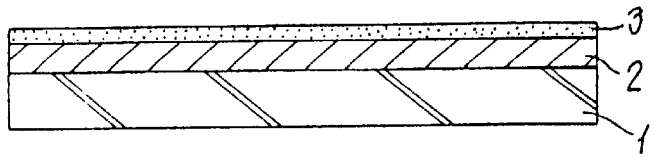
FIG. 1(*a*) to FIG. 1(*g*) schematically show a first gradation mask producing process according to the invention.

3: photoresist 4, 4': masks with shielding patterns in desired shapes
5: gradation mask
6: optical material
7, 7': photoresist
8, 8': optical materials

DETAILED DESCRIPTION OF THE INVENTION

In this specification, a "gradation mask" has a transmittance which varies two-dimensionally, and in a stepwise manner or continuously.

According to a first aspect of the invention, there is provided a gradation mask comprising a transparent substrate and metal and/or metallic compound on the substrate. The metal and/or metallic compound is in the form of a group of layers, each of which has a thickness Z(X, Y) varying in three or more steps in accordance with a desired distribution of transmittance in a two-dimensional region expressed by coordinates X and Y. In this case, the thickness Z(X Y)=0 is included as one of three or more steps.

In accordance with a second aspect of the invention, there is provided a gradation mask comprising a transparent substrate and metal and/or metallic compound on the substrate. The metal and/or metallic compound is in the form of a group of layers, each of which has a thickness $\xi(X, Y)$ continuously varying in accordance with a desired distribution of transmittance in a two-dimensional region expressed by coordinates X and Y.

Both the thicknesses Z(X, Y) and $\xi(X, Y)$ defined in claims 1 and 2 represent that the thickness is determined by the coordinates in the two-dimensional region, i.e. X and Y. The thickness is not always expressed by a function of double variables X and Y. In other words, the thickness can vary with only X or Y.

In the gradation mask defined in claim 1 or 2, the metallic compound can be chromium compound or metal oxide (claim 3).

In the gradation mask in claim 1 or 2, the metal which forms the layers can be titanium (Ti), tantalum (Ta), silicon (Si), chromium (Cr), aluminum (Al), tungsten (W), tin (Sn) or indium (In) (claim 4).

In the gradation mask in claim 3, the metal oxide which forms the layers can be titanium oxide ($TiO_{(2-x)}$), tantalum oxide ($Ta_2O_{(5-x)}$), silicon oxide ($SiO_{(2-x)}$), chromium oxide ($Cr_2O_{(3-x)}$), aluminum oxide ($Al_2O_{(3-x)}$), tungsten oxide ($W_2O_{(3-x)}$), tin oxide ($SnO_{(2-x)}$), or indium oxide ($In_2O_{(3-x)}$), or a combination of two or more materials selected from the foregoing oxide materials (claim 5).

With the gradation mask in claim 1 or 2, each layer of a group of layers can be formed by stacking a plurality of thin film of metal defined in claim 4 and the thin film of metal oxide defined in claim 5 (claim 6).

In the gradation mask according to claim 1 or 2, each layer of a group of layers may be formed of any of chromium (Cr), chromium oxide ($CrO_x$), chromium nitride ($CrN_x$), chromium oxide nitride ($CrO_xN_y$), or chromium nitride carbonate oxide ($CrO_xN_yC_z$), or may be formed by stacking two or more films of a material selected from the foregoing materials (claim 7).

Needless to say, the gradation mask may have only one layer. The foregoing gradation mask can further comprise an anti-reflection layer on at least one surface thereof (claim 8).

When a layer of the gradation mask is constituted by a plurality of metal and/or metallic compound films, the transmittance of the layer can be controlled not only by the thickness of the layer but also by compositions of each film.

In the gradation mask defined in claims 1 and 2, the description that "each layer has a thickness varying in three or more steps (or continuously)" also refers to a case where not only the thickness but also a composition of the layer vary in accordance with the distribution of transmittance.

According to claim 9, there is provided a method for forming a gradation mask, comprising a film forming step, a patterning step, and an etching step.

In the film forming step, a film of metal and/or metallic compound is uniformly formed on a transparent substrate so as to assure a transmittance of 10% or less.

The patterning step is for forming a mask pattern for attaining desired shapes onto the film of the metal and/or metallic compound.

In the etching step, the film of the metal and/or metallic compound is wet- or dry-etched using the formed mask pattern as a mask.

A photolithography technique is applicable to the patterning step.

The dry- or wet-etching step is anisotropic.

The patterning step and the etching step are alternately repeated as desired by forming different masks so as to produce a gradation mask with a group of the layers in which each layer of the metal and/or metallic compound has a thickness Z(X, Y) varying stepwise in three or more steps in accordance with a desired distribution of transmittance.

The method defined in claim 9 is called "the method by etching" for convenience of explanation.

In accordance with claim 10, there is provided a method for forming a gradation mask, comprising a patterning step and a film forming step.

In the patterning step, a mask with a negative pattern for attaining a desired shape is formed on a transparent substrate. A photolithograpic technique is applicable to this step. The negative pattern is opposite to the desired positive pattern. When the negative pattern is patterned as a mask on the substrate, the substrate has the desired positive pattern by the areas which are not coated by the patterned mask.

In the film forming step, a group of elementary films of metal and/or metallic compound is uniformly formed on the substrate using the mask.

The patterning step and the film forming step are alternately repeated as desired by forming different masks so as to form layers by stacking the elementary films on the substrate. Each layer has a thickness Z(X, Y) varying in accordance with a desired distribution of transmittance.

The method in claim 10 is called the "method by film stacking".

The method according to claim 9 further comprises treatment for smoothing the layers of the metal and/or metallic compound having the thickness varying in three or more steps such that the layers of the metal and/or metallic compound have a smoothly varying thickness $\xi(X, Y)$ (claim 11).

The smoothing treatment is performed by exposing the mask making pattern in a defocused state during the patterning process (claim 12). The smoothing treatment may be performed by thermally treating the masks after the patterning step so as to smooth edges of the masks, and by a dry-etching process in the etching step (claim 13).

The smoothing treatment may be also be performed by an isotropic dry- or wet-etching step (claim 14). The smoothing treatment may be further performed by thinly applying photoresist on the layers having the stepwise varying thickness Z(X, Y) so as to fill stepwise portions, and by etching the applied photoresist and the layers with a selection rate of 1 (claim 15). The smoothing treatment may be also performed by thinly applying a metal and/or metallic compound on the layers having the stepwise varying thickness Z(X, Y), and by performing the dry- or wet-etching step (claim 16).

The method defined in claim 10 may further comprise treatment for smoothing the stepwise varying thickness of the layers such that the layers have a continuously varying thickness ξ(X, Y) (claim 17). The smoothing treatment may be performed by exposing the mask making patterns with negative patterns in a defocused state during the patterning step (claim 18). The smoothing treatment may be performed by thinly applying photoresist on the layers having the stepwise varying thickness Z(X, Y) so as to fill stepwise portions, and by etching the layers carrying the photoresist thereon with a selection rate of 1 (claim 19). The smoothing treatment may be also performed by thinly applying a metal and/or metallic compound on the layers having the stepwise varying thickness Z(X, Y), and by performing the dry- or wet-etching step (claim 20).

In the methods defined in claims 16 and 20, either the dry- or wet-etching step is performed in order to compensate for the transmittance reduced by the metal and/or metallic compound which is thinly applied on the layers having the stepwise varying thickness Z(X, Y).

The foregoing methods are also effective in producing a gradation which has only one layer.

Claims 21 to 24 define methods for forming special surface profiles on materials.

According to claim 21, the method comprises the steps of: applying photoresist to a predetermined thickness on a substrate where the special surface profile to be formed; exposing the photoresist via the gradation mask defined in claim 1 in a defocused state so as to vary a thickness of the photoresist in accordance with the special surface profile; and anisotropically etching the photoresist and the substrate so as to transfer the special surface profiles of the photoresist onto the substrate.

In claim 22, the method comprises the steps of: applying photoresist to a predetermined thickness on a substrate where the special surface profiles are to be formed; exposing the photoresist via the gradation mask defined in claim 1 so as to stepwise vary a thickness of the photoresist in accordance with the special surface profiles; thermally deforming the photoresist so as to smooth the stepwise varying thickness of the photoresist; and anisotropically etching the photoresist and the substrate so as to transfer the special surface profiles of the photoresist onto the substrate.

According to claim 23, the method comprises the steps of: applying photoresist to a predetermined thickness on a substrate where the special surface profiles are to be formed; exposing the photoresist via the gradation mask defined in claim 1 so as to stepwise vary a thickness of the photoresist in accordance with the special surface profiles; thinly applying photoresist on the photoresist so as to smooth stepwise portions; and anisotropically etching the photoresist and the substrate so as to transfer the special surface profiles of the photoresist onto the substrate.

In accordance with claim 24, the method comprises the steps of: applying photoresist to a predetermined thickness on a substrate where the special surface profiles are to be formed; exposing the photoresist via the gradation mask defined in claim 2 in a defocused state so as to continuously vary a thickness of the photoresist in accordance with the special surface profiles; and anisotropically etching the photoresist and the substrate so as to transfer the special surface profiles of the photoresist onto the substrate.

The methods in claims 21 to 24 relate to the formation of curved surfaces having continuously varying profiles. Surfaces having stepwise varying profiles can be formed by closely contacting the gradation mask with the photoresist and exposing the photoresist via the gradation mask in the method defined in claim 20. Needless to say, these methods are also effective in producing a grading mask which has a single curved surface.

DESCRIPTION OF THE PREFERRED EMBODIMENTS

The invention will be described with reference to the embodiments shown in the drawing figures.

According to the method defined in claim 9, a gradation mask is produced as shown in FIGS. 1(a) to 1(g). The gradation mask will be used so as to form convex surface profiles for optical elements.

Referring to FIG. 1(a), a transparent synthetic quartz substrate 1 has a small coefficient of thermal expansion, and is relatively free from distortion and bubbles. A chromium compound film 2 is uniformly formed on the synthetic quartz substrate 1 as a metallic compound film. The chromium compound film 2 has a thickness for assuring a transmittance of 10% or less.

Specifically, the chromium compound film 2 is a metallic chromium (Cr) film, a chromium oxide ($CrO_x$) film, a chromium nitride ($CrN_x$) film, a chromium oxide nitride ($CrO_xN_y$) film, a chromium oxide nitride carbide ($CrO_xN_yC_z$) film or the like. The thickness of the chromium compound film 2 to attain the transmittance of 10% or less depends upon the kind of film materials.

Positive photoresist 3 is applied on the chromium compound film 2 to an adequate thickness, using a photolithographic technique. The thickness of the photoresist 3 depends upon an etching rate of the chromium compound film 2 and a selection rate of the photoresist 3 to the chromium compound film 2, and preferably approximately 1 μm or more.

Figure 1B:
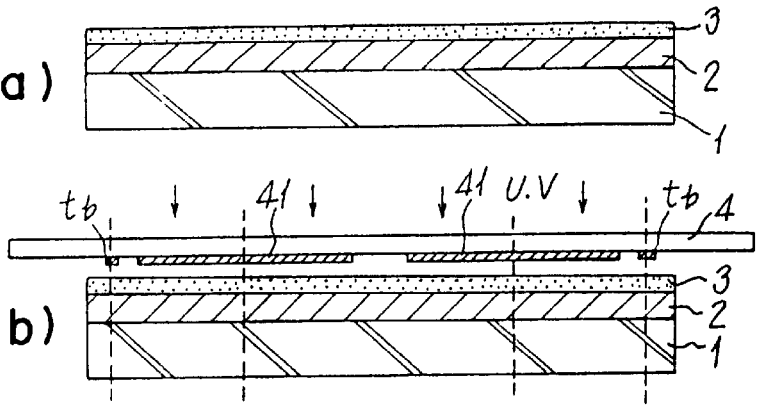

Referring to FIG. 1(b), the photoresist 3 is exposed via a mask 4 using ultraviolet light U.V. The mask 4 is a transparent, plane parallel plate which has chromium films with first patterns 41 as a mask making pattern on a surface thereof. Each first pattern 41 is one of patterns used in order to form a final shape having a thickness defined by Z(X, Y). The first pattern 41 is used to form the first step portion of the stepwise thickness Z(X, Y). The mask 4 also has aligning patterns tb.

The photoresist 3 exposed via the mask 4 is developed and rinsed, and then has a pattern in accordance with the first patterns 41. Application of the photoresist 3, exposure, development and rinsing of the photoresist 3 constitute a patterning step. The first patterns 41 are in close contact with the photoresist 3 when the exposure is executed, despite the indication in FIG. 1(a).

Figure 1C:
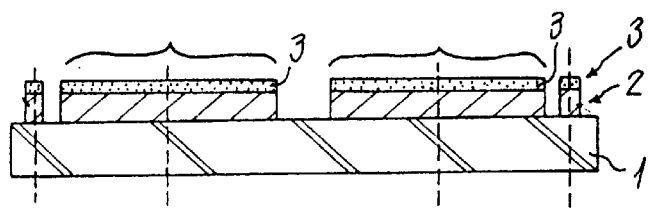

The photoresist having the copied first pattern 41 is used as a mask for wet-etching the chromium compound film 2 with an enchant (an etching step). After the wet-etching, the chromium compound films 2 and the photoresist 3 are in the shape of the first pattern 41 (together with the aligning patterns) on the synthetic quartz substrate 1 as shown in FIG. 1(c). The chromium compound films 2 and the photoresist 3 in FIG. 1(c) correspond to the two-dimensional shape of optical elements as a final object to be produced.

Figure 1D:
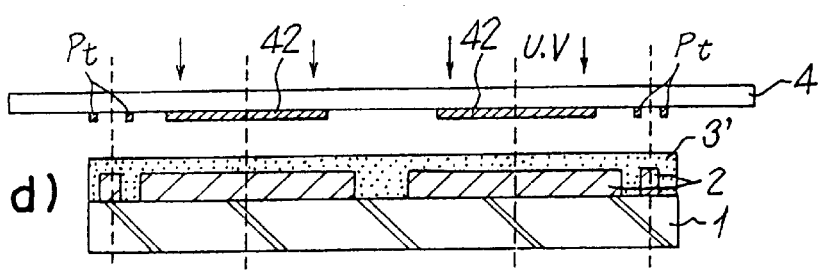
Figure 1E:
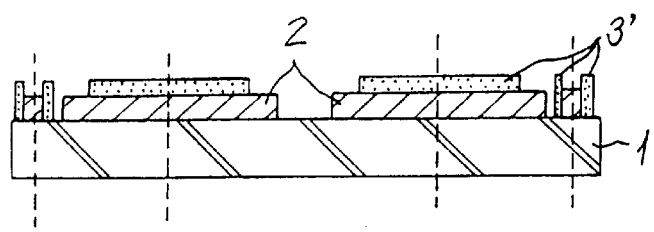

After removing the photoresist 3, positive photoresist 3' is applied on the patterned chromium compound films 2 having the first patterns and the aligning patterns, and is exposed via a mask 4', as shown in FIG. 1(d). The mask 4' has second patterns 42 as a mask making pattern and aligning patterns pt which are counterparts of the aligning patterns tb. The mask 4' is in close contact with the photoresist 3 when the exposure is executed, despite the indication in FIG. 1(d).

Figure 1F:
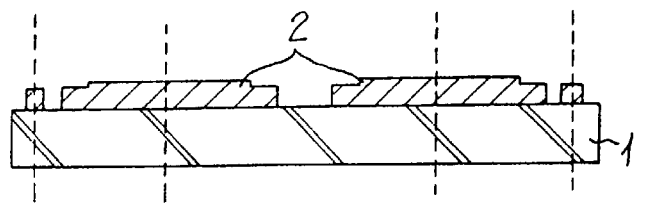

The exposed photoresist 3' is developed and rinsed, so that a part of each patterned chromium compound film 2 is uncovered (i.e. the photoresist 3' is removed from an area thereof where the second copied pattern is absent). In this state, the chromium compound films 2 are dry- or wet-etched to a predetermined depth using the photoresist 3' as a mask (i.e. an etching step). Then, the photoresist 3' is removed. Each patterned chromium compound film 2 has a stepwise structure as shown in FIG. 1(f).

Hereinafter, third, fourth, . . . patterns will be copied one after another in the patterning step. The patterning and etching steps will be alternately repeated as desired, thereby obtaining a stepwise surface profile. An i-th pattern has a shape identical to a shape which is obtained by slicing the surface profile at an i-th step (i =1, 2, 3, . . . ) and viewed in the direction Z. The surface profile has a thickness Z(X, Y). An (i+1)-th pattern is smaller than the i-th pattern.

Figure 1G:
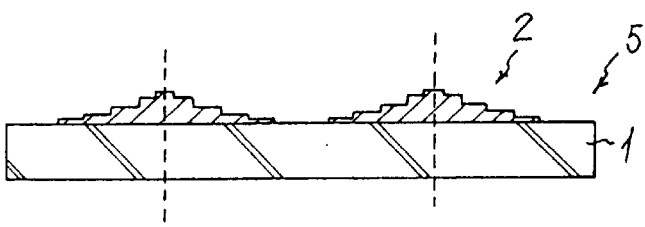

Referring to FIG. 1(g), the layers 2 of the chromium compound film have a surface profile with the thickness Z(X, Y) varying three or more steps. The chromium compound film 2 shown in FIG. 1(a) is completely etched at positions where no chromium compound film 2 is necessary, i.e. where the transmittance of the synthetic quartz crystal itself should be retained.

Each chromium compound layer 2 has the stepwise varying thickness Z(X, Y) as shown in FIG. 1(g), i.e. each chromium compound layer 2 retains its original thickness, shown in FIG. 1(a), where the transmittance is 10% or less. The chromium compound layers 2 become thinnest at a periphery of the copied first pattern 41. The thinner the chromium compound layers 2, the higher the transmittance will increase in a stepwise manner.

The chromium compound layers 2 of FIG. 1(g) have a large transmittance at the periphery of the copied first pattern. The transmittance is equal to that of the synthetic quartz substrate 1 at positions where there is no chromium compound layer 2 left.

Alternatively, the chromium compound film 2 in FIG. 1(a) may be replaced with a film of titanium oxide $TiO_{(2-x)}$, tantalum oxide $Ta_2O_{(5-x)}$, silicon oxide $SiO_{(2-x)}$, chromium oxide $Cr_2O_{(3-x)}$, aluminum oxide $Al_2O_{(3-x)}$, tungsten oxide $W_2O_{(3-x)}$, tin oxide $SnO_{(2-x)}$, or indium oxide $In_2O_{(3-x)}$, or a combination of two or more materials selected from the foregoing materials.

Such layers 2' of a metal oxide compound will be formed as shown in FIGS. 2(a) to 2(g). In these drawing figures, identical reference numerals denote parts identical to those shown in FIGS. 1(a) to 1(g).

Further, a metal film of titan (Ti), tantalum (Ta), silicon (Si), chromium (Cr), aluminum (Al), tungsten (W), tin (Sn), or indium (In) may be used in place of the chromium compound film 2 or metal oxide film 2'. It is still possible to stack a metal film and a metal oxide film on the substrate in place of the chromium compound film 2 or metal oxide compound film 2' in FIG. 1(a) and FIG. 2(a).

In the embodiment shown in FIGS. 1(a) to 1(g), when the chromium compound film 2 of FIG. 1(a) includes component films of metallic chromium (Cr), chromium oxide ($CrO_x$), chromium nitride ($CrN_x$), chromium oxide nitride ($CrO_xN_y$), or chromium oxide nitride carbide ($CrO_xN_yC_z$), a first component film should be in good contact with the transparent substrate. When the transparent substrate is synthetic quartz, the metallic chromium film is preferably used as the first component film.

Figure 2A:
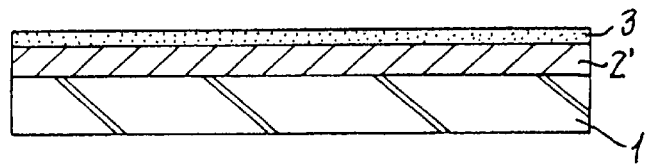
FIG. 2(*a*) to FIG. 2(*g*) schematically show a second gradation mask producing process according to the invention.
Figure 2B:
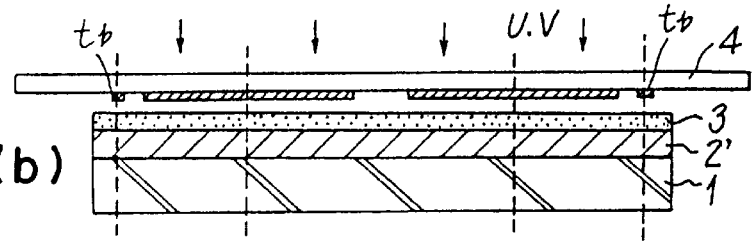
Figure 2C:
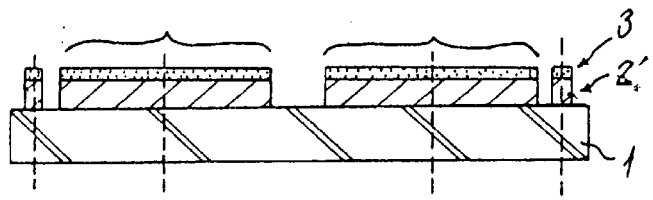
Figure 2D:
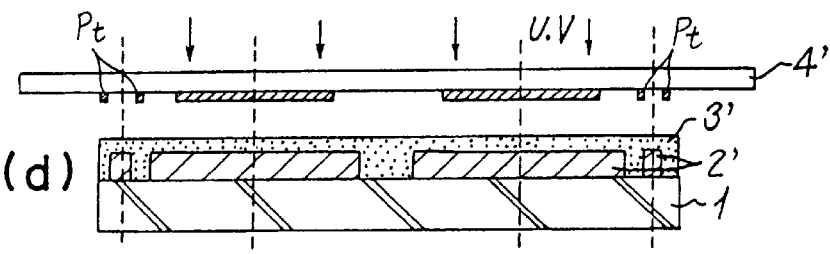
Figure 2E:
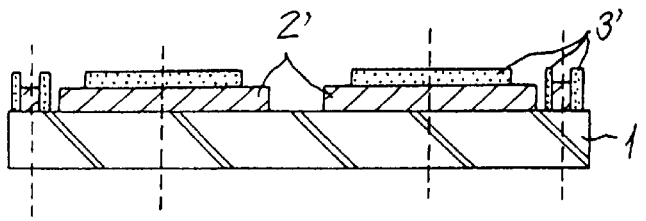
Figure 2F:
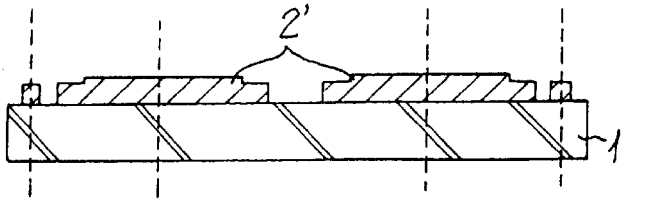
Figure 2G:
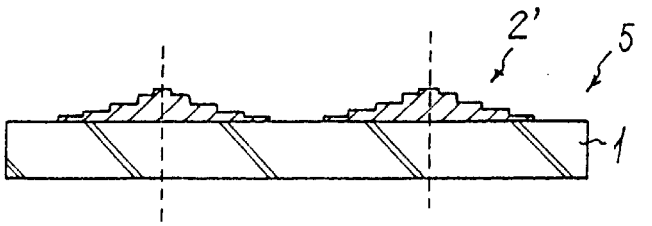

Each chromium compound film 2 (FIG. 1(g)) and each metal oxide film 2' (FIG. 2(g)) have the stepwise varying thickness Z(X, Y). When viewed down from a direction Z (upward direction in FIGS. 1(g) and FIG. 2(g)), each chromium compound film 2 or each metal oxide film 2' seems to have a shape depicted by contour lines.

Generally the contour lines join points of equal altitudes, and an altitude difference between neighboring lines is constant. In this case, however, the contour lines correspond to the step portions of the thickness Z(X, Y), and the step widths of the step function Z(X, Y) are not required to be equal.

It is possible to approximate the transmittance, which varies two-dimensionally with a continuous two-dimensional function T(X, Y), by the gradation mask with stepwise varying transmittance as follows.

A continuous two-dimensional function $\xi(X, Y)$ corresponding to T(X, Y) is determined first. Then, a step function Z(X, Y) for approximating the two-dimensional function $\xi(X, Y)$ is determined with desired precision. Then, the gradation mask is formed in such a manner that it has layers whose thickness is Z(X, Y). The smaller the step width of the thickness expressed by the step function Z(X, Y), and the more steps, the more effectively Z(X, Y) approximates the continuous two-dimensional function $\xi(X, Y)$.

Even when the layers (with the stepwise varying thickness Z(X, Y)) of the gradation mask have to approximate a complicated three-dimensional profile expressed by $\xi(X, Y)$, two-dimensional shapes of the mask making pattern used in the patterning steps are simple ones, e.g. they are polygonal, circular, oval and so on.

In the foregoing embodiment, the first pattern 41 is the largest, and the second, third, . . . i-th patterns gradually become smaller.

In the case of a convex surface profile having the thickness Z(X, Y), it is also possible to form a layered structure in a sequence opposite to that described above. For example, an (n)-th mask making pattern which corresponds to the thickest and smallest part is first used in the first patterning step, an (n−1)-th pattern larger than the (n)-th pattern is copied on the (n)-th pattern in the second patterning step, an (n−2)-th pattern larger than the (n−1)-th pattern is formed on the (n−1)-th pattern in the third patterning step, and so on. In other words, a mask making pattern with the (n)-th pattern is first used in order to accomplish the lowest transmittance. The photoresist to be left as it is gradually increased, and etched. This gradation mask can have the layers whose thickness varies as shown in FIG. 1(g) or FIG. 2(g).

When doughnut patterns are used as a mask making pattern in the patterning step, it is possible to form a concave profile whose thickness varies in a stepwise manner and which approximate the smooth concave surface. Further, when the doughnut patterns and circular patterns are used in combination, it is possible to form a profile whose thickness Z(X, Y) varies in such a manner as to offer maximum or minimum transmittance from the center to the periphery of the pattern.

As described above, it is possible to form the gradation masks 5 including the metal and/or metallic compound layers 2 whose thickness varies stepwise as shown in FIG. 1(g) and FIG. 2(g).

The following describe the method of producing a gradation mask defined in claim 10 (method by film stacking).

First of all, a mask with a negative pattern of a desired shape is formed on a transparent substrate (not shown). A metal and/or metallic compound film of a desired thickness is formed on the transparent substrate having the mask with the negative pattern. When the mask is removed, the metal and/or metallic compound elementary films (elementary films) on the substrate have the desired shape with a desired uniform thickness (film forming step).

For this purpose, a negative photoresist is used as a photoresist 3 of FIG. 1(b). After the exposure of the negative photoresist via the mask 4, the portions shadowed by the patterns 41 are removed. Thus, the surface portions corresponding to the patterns 41 are uncovered, so that metal and/or metallic compound elementary films formed with adjusted thickness just on the surface of the substrate have the patterns 41 replicated thereon as first step parts of the layers having the stepwise varying thickness Z(X, Y).

Then, the negative photoresist used as the mask is removed, and the mask of photoresist with the negative patterns of the second step part of the thickness Z(X, Y) is formed on the substrate having the metal and/or metallic compound elementary films in the same manner, and the metal and/or metallic compound elementary films are stacked on the first step parts of the layers. The foregoing step is repeated until a desired number of compound elementary films are laid on one after another. The metal and/or metallic compound layers 2 shown in FIG. 1(g) or FIG. 2(g) can be formed, which have three or more steps. Each layer formed with elementary films stacked on each other has the thickness Z(X, Y). Thus, a gradation mask can be obtained as desired.

In this case, it is possible to obtain a gradation mask in the following manner. Specifically, an exposure mask with a mask making pattern, which is patterned so as to remove the photoresist only at an area where the transmittance should be kept minimum, is used first so as to expose the foregoing area. Next, a mask making pattern for an area where the transmittance is increased is used to enlarge the domain not to be covered by the photoresist. Thereafter, the film forming step will be repeated.

The elementary films to be stacked may be a metal oxide film of $TiO_{(2-x)}$, $Ta_2O_{(2-x)}$, $SiO_{(2-x)}$, $Cr_2O_{(3-x)}$, $Al_2O_{(3-x)}$, $W_2O_{(3-x)}$, $SnO_{(2-x)}$, or $In_2O_{(3-x)}$, or combination of materials selected from the foregoing groups. Further, the film may be made of combination of materials such as Ti, Ta, Si, Cr. Al, W, Sn and In. Still further, the film may be made of metallic chromium Cr, chromium oxide $CrO_x$, chromium nitride $CrN_x$, chromium oxide nitride $CrO_xN_y$, or chromium oxide nitride carbonate $CrO_xN_yC_z$.

The more the patterning and etching steps, or the more the patterning and film forming steps, the more precisely the continuously varying thickness of the layers will be approximated. When the surface profile such as aspherical convex having maximum and minimum points, the more the patterning and etching steps will be repeated more frequently near an inflection. Actually, the number of repetitions of the foregoing steps depends upon the transmittance of the chromium compound layer or the like, sensitivity of the photosensitive material (γ characteristics, i.e. sensitivity depending upon an amount of radiated beams, and an amount of exposure beams), a target surface profile (Z(X, Y)), and so on.

The gradation mask is used to produce an optical element having a special surface profile (as shown in FIGS. 3(a) to 3(c-2)).

The gradation mask 5 (shown in FIG. 1(g)) is used as an exposure mask. Referring to FIG. 3(a), positive photoresist 7 is applied to a predetermined thickness on a substrate 6 made of an optical material. The positive photoresist 7 is exposed via the gradation mask 5. Exposure beams are distributed on the positive photoresist 7 in accordance with the transmittance varying with the thickness of the chromium compound layers 2. The exposed portions of the positive photoresist 7 are removed in the succeeding development and rinsing steps. Thus, the surface profile of the chromium compound layers 2 on the gradation mask 5 is replicated on the photoresist 7, thereby obtaining a photoresist 7', as shown in FIG. 3(b).

Then, the photoresist 7' and the substrate 6 are dry-etched, thereby obtaining an optical element 8 on which the stepwise surface profile of the gradation mask 5 is replicated as shown in FIG. 3(c-1).

When the following smoothing treatment is incorporated into the fabrication of the gradation mask or into the formation of special surface profile, the optical element 8 can have a smooth surface profile as shown in FIG. 3(c-2).

By the exposure using the gradation mask 5 under the same exposure conditions, one can always have the same profile of the photoresist. Therefore, the gradation mask is very effective in promoting the mass production of the optical elements or the like on which special surface profiles should be formed. Further, in the patterning step, it is possible to select a desired mask making pattern (i.e. an i-th pattern) in accordance with a target profile (having a layer whose thickness is defined as Z(X, Y) or ξ(X, Y)), and also possible to increase the number of the mask making patterns. This means that special surface profiles can be formed precisely and easily.

The stepwise surface profile will be smoothed as described hereinafter (smoothing treatment).

While the gradation mask is being produced, the stepwise profile of its metal and/or metallic compound layers is smoothed so that the layers have the continuously varying thickness ξ(X, Y).

In order to pattern the photoresist 3 using the mask 4 shown in FIG. 1(b) or FIG. 2(b), the photoresist 3 is exposed via the mask 4 which is slightly moved so as to be out of contact with the photoresist 3, i.e. in a defocused state. In this defocused state, the mask making patterns 41 on the mask 4 are exposed on the photoresist 3, so that the peripheral area of the photoresist 3 shielded by the patterns 41 will be blurred. Thus, the photoresist 3 will be sloped in the blurred area. When the photoresist 3 is etched, the sloped portion will be replicated as the smooth and continuously varying portion on the metal and/or metallic compound film.

When the smoothing treatment is performed in each patterning step, the metal and/or metallic compound layers will have the continuously varying thickness ξ(X, Y).

Alternatively, the smoothing treatment can be performed by exposure in the defocused state and by controlling a concentration and/or temperature of a developer. In other words, the more dilute the developer or the lower the developer temperature, the longer the developing time and the more extensively the stepwise profile will be smoothed.

The patterning step performed in the defocused state is also applicable to a method to be defined in claim 10.

In a method to be defined in claim 9, a mask in each patterning step may be thermally treated so as to curve a peripheral edge of the patterned mask. Then, the mask and metal and/or metallic compound film is dry-etched, so a curved smooth shape is replicated on the metal and/or metallic compound film (claim 13).

In the method defined in claim 9, each etching process may be executed by isotropic etching, in which etching is performed in every direction. This is effective in smoothing edges of stepwise layers (claim 14).

Further, the following smoothing treatment is conceivable: photoresist is thinly applied on the metal and/or metallic compound layers having the stepwise varying thickness Z(X, Y) (formed by the method defined in claims 9 and 10, and shown in FIGS. 1(g) and 2(g)) so as to smooth the edges of the stepwise layers, and then is etched at the selection rate of 1 (claims 15 and 19).

Still further, it is possible to smooth the edges of the metal and/or metallic compound layers (formed by the method defined in claims 9 or 10, and shown FIG. 4(c-1)) in the following method. As shown in FIG. 4(c-2), a metal and/or metallic compound is thinly vacuum-evaporated on the metal and/or metallic compound layers having the stepwise varying thickness Z(X, Y) so as to smooth the step portions, and is then dry- or wet-etched. Thus, the metal and/or metallic compound layers have the stepwise portions smoothed as shown in FIG. 4(c-3) (claims 16 and 20).

Specifically, when the sputtering step is performed at a high substrate temperature and a high vacuum evaporation pressure, a vacuum evaporation material such as a chromium compound is deposited mainly on the stepwise portions of the chromium compound layers 2, thereby smoothing the stepwise portions. Then, dry- or wet-soft etching is uniformly performed so as to correct the offset distribution of transmittance reduced due to the application of the vacuum evaporation material, thereby smoothing the stepwise portions. This soft etching step will be repeated until the stepwise portions are completely smoothed, if necessary.

The smoothing treatment may be also performed while special surface profiles are formed using the gradation mask as defined in claim 1.

Photoresist is applied, to a predetermined thickness, on the surface of a substrate where special surface profiles to be formed. The photoresist is exposed via a gradation mask with the distribution of transmittance varying stepwise in accordance with the special surface profile to be formed (i.e. stepwise variation of the thickness of the layers constituting the gradation mask) after the development. The photoresist whose thickness varies in a stepwise manner is thermally deformed so as to smooth its stepwise variation of thickness, and is subject to the anisotropic etching together with the substrate. Thus, the surface profile of the photoresist is replicated on the surface of the substrate, which has a smoothed surface profile (claim 21).

The smoothing treatment may be further performed as follows. Referring to FIG. 4(a-1), photoresist is applied on the surface of the substrate to a predetermined thickness so as to form a photoresist layer 7. The gradation mask 5 including the chromium compound layers 2 having the stepwise varying thickness is aligned with the photoresist layer 7. Then, the photoresist layer 7 is exposed via the gradation mask 5 in a defocused state. After the development and rinsing, the photoresist layers 7 shown in FIG. 4(a-2) have smooth profiles, and are subject to the anisotropic etching together with the substrate 6. The smoothed surface profiles of photoresist 7' are replicated on the substrate 6 (claim 22).

Still further, it is possible to obtain smooth surface profiles as follows. First, stepwise surface profiles of metal and/or metal compound layers (of an exposure mask) are replicated onto photoresist 7' (on the substrate 6) as shown in FIG. 4(b-1). Then, additional photoresist (not shown) is thinly applied on the photoresist 7' so as to smooth the replicated surface profile (FIG. 4(b-2)). The photoresist 7' of FIG. 4(b-2) and the substrate 6 are etched in order to replicate the smooth surface profile on the substrate 6.

Any of the foregoing smoothing treatment are effective in producing the optical element 8' having the smooth surface profile as shown in FIG. 3(c-2).

The gradation mask defined in claim 2 has metal and/or metal compound layers with the thickness $\xi(X, Y)$ which varies gradually and smoothly, so the smooth surface profile can be formed on the substrate without any smoothing treatment.

The foregoing methods are applied in the following nine examples. The examples 1, 3, 6 and 8 relate to the formation of lenses having special surface profiles for microlens arrays.

Figure 10:
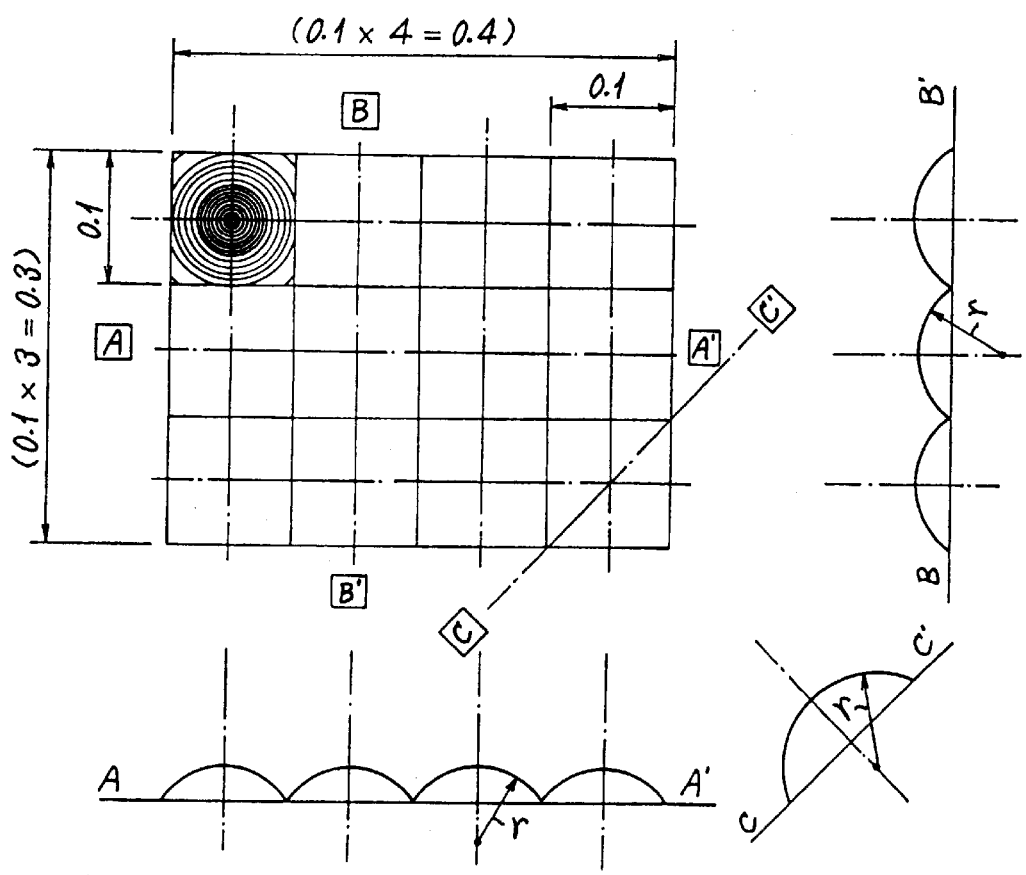
FIG. 10 shows a microlens array in which each microlens has the same special surface profile.

FIG. 10 shows an optical element, i.e. a microlens array to be formed in the examples 1, 3, 6, and 8.

Further, FIG. 10 shows the arrangement of microlenses in a (3×4) matrix, and cross section taken along lines A-A', B-B' and C-C' of the optical element. These microlenses have the same shape. This microlens array is applicable to a parallel exposure optical system for a holographic 3D printer.

Examples 2, 4, 5, 7 and 9 relate to the formation of optical elements having arrays of pyramidal surface profiles.

FIG. 12-0 is a side view of a pyramidal bump. Each pyramidal bump has a base of 0.1 mm×0.1 mm. The optical element has the same pyramidal bumps arranged in a (3×4) matrix similarly to the microlenses shown in FIG. 10.

EXAMPLE 1

Figures 5A, 5B:
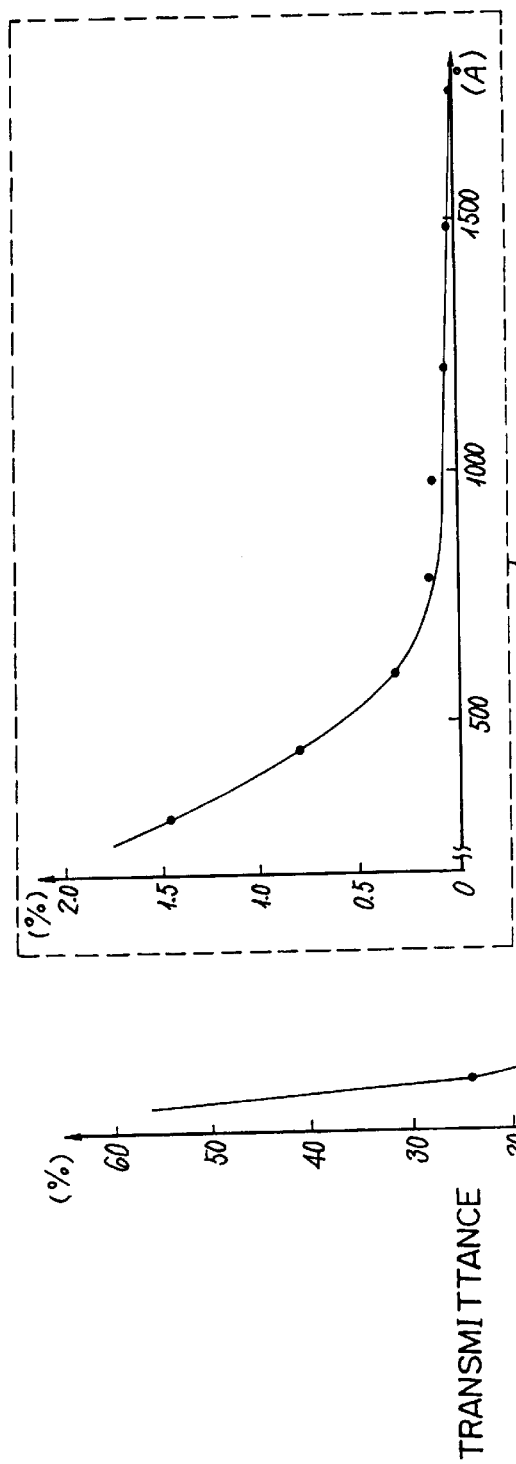
FIGS. 5A and 5B shows the relationship between a thickness and transmittance of a chromium film on a synthetic quartz substrate.

A chromium film was formed on a high purity synthetic quartz substrate by the sputtering step. FIGS. 5A and 5B shows the relationship between the film thickness and transmittance of the chromium film with respect to i-ray (having wavelength of 365 nm) of a mercury lamp for irradiating ultra violet light.

Figure 7:
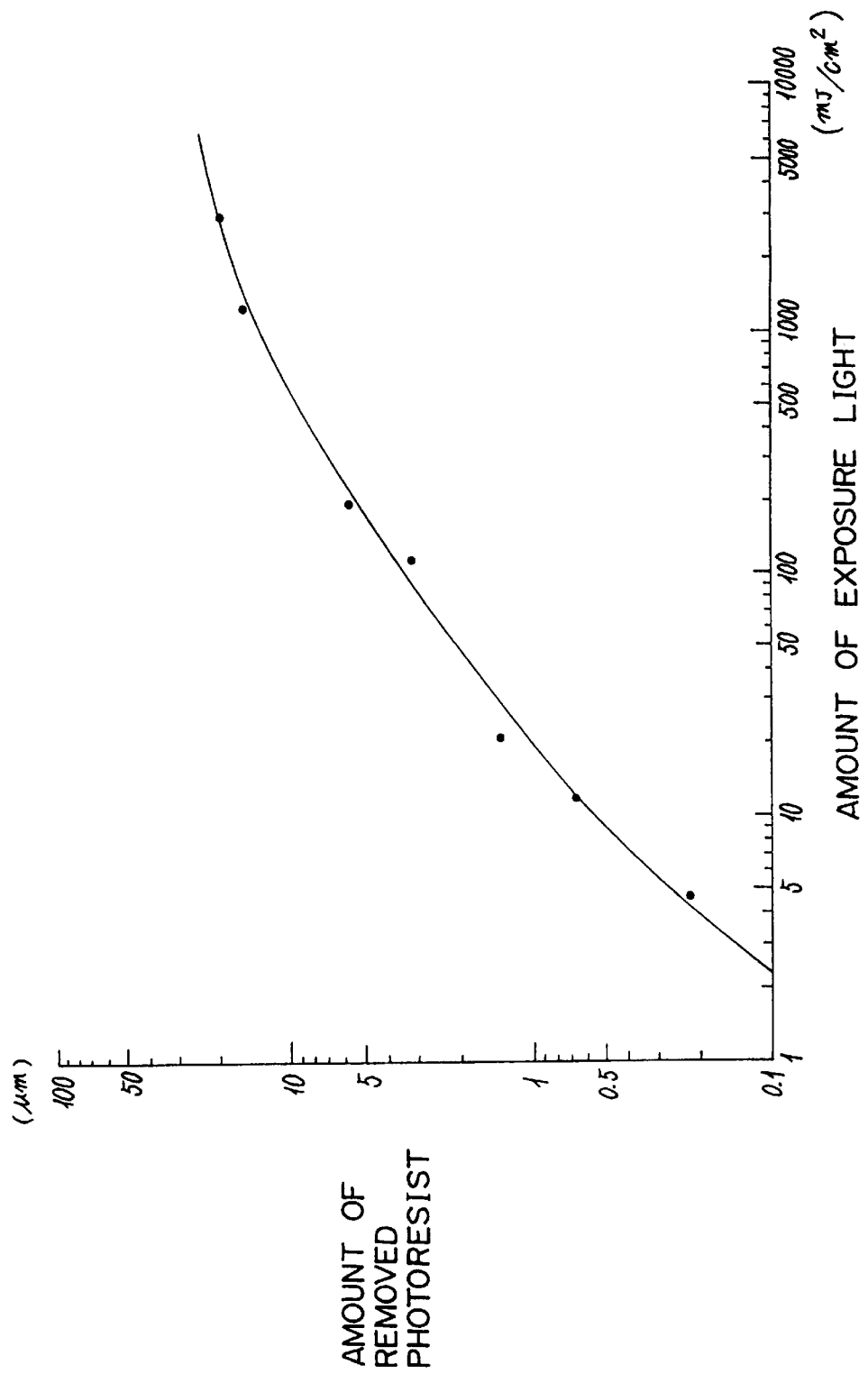
FIG. 7 shows the relationship between an amount of exposure beam and the thickness of removed photoresist after the positive photoresist is exposed, developed and rinsed.

FIGS. 6A and 6B shows the relationship between the thickness of chromium film and a thickness of removed photoresist (quantity of irradiated light: 2500 mJ/cm$^2$) when "POSI-RESIST" OFPR-800 (manufactured by Tokyo Ohka, Co., Ltd.) is used as photoresist and is exposed via the chromium film. FIG. 7 shows the relationship between an amount of exposure light and the thickness of removed photoresist (in this case, inclinations of curves denote sensitivity of the photoresist to light, i.e. y value).

A gradation mask is manufactured as described hereinafter. A transparent synthetic quartz substrate is cleaned first of all, and is placed in a planar magnetron sputtering apparatus (manufactured by ANELVA CO., LTD., SPP apparatus). A reverse RF sputtering step is carried out for ten minutes under the following conditions: introduction of 30 sccm of an Ar gas into a bell jar; a pressure in the bell jar (called "bell jar pressure" hereinafter) of 12 mTorr; and effective power of 85 W.

Thereafter, metal chromium is used as a target material, and is DC-sputtered for 24 minutes under the following conditions: introduction of 30 sccm of Ar gas; a bell jar pressure of 6.5 mTorr; and an output current of 1.1 A. A 2000 Å thick chromium film is obtained on the synthetic quartz substrate. As can be seen from FIG. 5, the chromium film has the transmittance 0%.

It is necessary to prepare aligning patterns in order to align a number of desired patterns ("i-th" pattern, i=1, 2, ...) on the chromium film. "POSI-RESIST" OFPR-800 (trade name) is applied on a synthetic quartz substrate having a chromium film thereon. The POSI-RESISIT is prebaked, thereby forming a photoresist layer. The photoresist layer is exposed via the mask which has aligning patterns and an effective optical element area (for covering the area domain where microlenses are arranged in a 3×4 matrix). The photoresist layer is then developed and rinsed, thereby having a mask for covering the aligning patterns and the effective optical element area.

The chromium film is wet-etched via the mask for 50 seconds using an enchant which consisted of 15 g of nitrate secondary cerium•ammonium, 5 cc of perchloric acid solution, and 100 cc of distilled water. Thus, the chromium film including the aligning patterns and the effective optical element area is obtained on the synthetic quartz substrate. "POSI-RESIST" OFPR-800 (trade name) is applied on the substrate with the chromium film, and is prebaked.

The prebaked POSI-RESIST layer is aligned with a mask having first mask making pattern and mating aligning patterns, is exposed via the mask, and is developed and rinsed. The first mask making pattern has 12 same patterns arranged in a 3×4 matrix. Each first pattern (shown in FIG. 11 (11-1) is geometrically determined on the basis of the relationships shown in FIGS. 5 to 7, and desired profile precision of optical elements. Photoresist having patterns congruent to the first pattern is left on the chromium film.

This photoresist mask is used to dry- or wet-etch the chromium film to a predetermined depth.

In the case of the wet-etching, an etchant contains 15 g of nitrate secondary cerium•ammonium, 5 cc of perchloric acid solution, and 300 cc of distilled water. An etching period is controlled so as to accomplish a desired level of etching. The etchant may be further distilled when the etching depth should be controlled in the unit of several ten Å.

ECR etching, RIE etching or TCP etching is preferable as the dry-etching step. Especially, the RIE etching is suitable.

In the Example 1, the ECR etching is performed under the following conditions: a bell jar pressure of $3 \times 10^{-4}$ Torr; introduction of 10 sccm of $CCl_4$ gas; and an output power of 450 W. An etching rate is 25 Å/minute. For example, it takes six minutes to etch the chromium film to a depth of 150 Å in this case.

The etching depth of the chromium film is controlled by adjusting the etching period based on an etching rate measured beforehand.

In the foregoing etching step, the chromium film is etched by an amount geometrically determined beforehand so as to form a step. A dry-etching rate is relatively small, i.e. 5 to 80 Å/minute. On the other hand, a wet-etching rate is large, i.e. 1000 Å/minute to 2000 Å/minute. Therefore, the dry-etching is preferable for precisely controlling an etched depth of the chromium film.

The foregoing patterning and etching steps are repeated. In this case, each area to be shielded by each i-th pattern (i.e. the area of the chromium film covered by the photoresist layer so as not to be etched) becomes smaller as the foregoing steps are repeated.

The special surface profile to be created using the gradation mask is a refracting surface of a microlens. Referring to FIG. 10, the microlens array includes the same convex microlenses arranged in 3 rows and four columns (3×4). One convex microlens is present per 0.1 mm² area. Therefore, the gradation mask should have (3×4) bumps as metal and/or metal compound layers formed in accordance with the target arrangement of the microlenses.

Each layer is formed using 15 circular mask making patterns, and has a thickness Z(X, Y). In this case, a total of 12 layers having the thickness Z(X, Y) are arranged in the matrix of 3×4. Each layer is rotationally symmetrical to the Z axis, and the thickness of the layer becomes larger toward the center of the layer. The first to fifteenth mask making patterns are prepared in order to form each layer on the gradation mask. The mask making patterns have different sizes, e.g. an (i+1)-th pattern is smaller than the i-th pattern.

FIGS. 11-1 to 11-15 show these 15 circular mask making patterns, i.e. shaded portions. Each mask making pattern (shown in FIG. 11) has a contour expression of the layer. In the patterning step, the same patterns are arranged in 3 rows and 4 columns (3×4).

The patterning and etching steps are alternately performed onto the substrate 15 times by using the fifteen mask making patterns one after another. Needless to say, the substrate and the mask making patterns are aligned using the aligning patterns.

Thus, one gradation mask has 12 (3×4) layers. Each layer has 16 levels of transmittance axi-symmetrically varying with respect to i-ray (having wavelength of 365 nm) of a mercury lamp (i.e. maximum transmittance is 92% at an area where the chromium film is removed, and minimum transmittance is 0% where the chromium layers retains its original thickness).

The foregoing gradation mask is used to form a microlens array as shown in FIG. 10.

A synthetic quartz substrate, as a microlens array material, is covered with "POSI-RESIST" OFPR-800 (manufactured by Tokyo Ohka, Co., Ltd.) to a thickness of 20 μm, and is prebaked, thereby obtaining a photoresist layer. The photoresist layer is closely contacted with the gradation mask, and is exposed via the gradation mask with light of 2500 mj/cm².

Then, the photoresist layer is developed, rinsed, and postbaked at 150° C. for 20 minutes. The stepwise variations of thickness (in accordance with the stepwise varying transmittance of the gradation mask) of photoresist bumps are thermally smoothed. Therefore, the photoresist bumps have convex surface profiles whose maximum height is 20 μm. These convex surface profiles are identical to the refracting surfaces of the microlenses constituting a microlens array.

The synthetic quartz substrate carrying the foregoing photoresist bumps is ECR-etched by an ECR etching apparatus for 200 minutes under the following conditions: a bell jar pressure of $5.5 \times 10^{-4}$ Torr; introduction of 25 sccm of $CF_4$ gas; and an output power of 450 W.

The surface profile of the photoresist bumps is replicated on the synthetic quartz substrate. Thus, the synthetic quartz substrate has the microlenses on its surfaces as desired.

The gradation mask is repeatedly used to form foregoing optical elements. It has been confirmed that the gradation mask is as effective as an ordinary exposure mask, is repeatedly usable, and is applicable to mass-production of optical elements at a reduced cost.

EXAMPLE 2

A transparent synthetic quartz substrate for a gradation mask is cleaned, is placed into the planar magnetron sputtering apparatus, and is subject to RF reverse sputtering for ten minutes by introducing 30 sccm of Ar gas, at a bell jar pressure of 12 mTorr, and with an effective power of 85 W.

The synthetic quartz substrate is DC-sputtered for 21 minutes under the following conditions: use of metallic chromium as a target material; introduction of 20 sccm of Ar gas; a bell jar pressure of 6.5 mTorr; and an output current of 1.1 A. An obtained chromium compound film (chromium oxide film) is 2500 Å thick. The number of oxygen atoms in the chromium compound is 1.1 for one chromium atom. The chromium compound film has the transmittance of 5%. The transmittance of a portion where no chromium film is present (i.e. transmittance of the synthetic quarts substrate) is 92%.

Aligning patterns are made similarly to those in Example 1.

Figure 9:
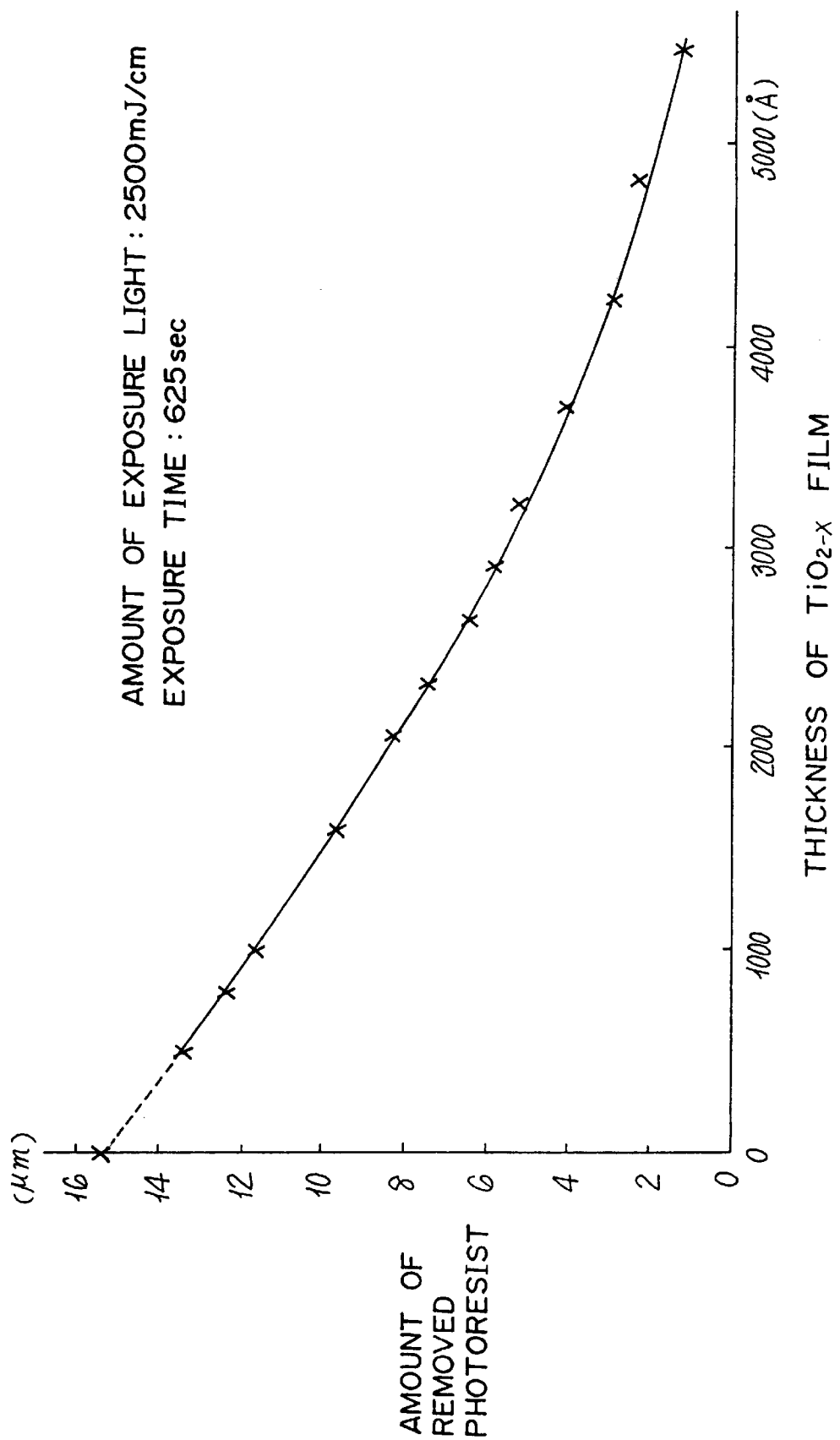
FIG. 9 shows the relationship between a thickness of the titanium oxide film and a thickness of removed photoresist after the positive photoresist is exposed via the titanium oxide film.

Nine mask making patterns (i-th patterns: i=1~9) are used for forming one pyramidal bump. FIGS. 12-1 to 12-9 show these nine patterns.

The gradation mask to be made has 3×4 pyramidal bumps. One pyramidal bump is formed using nine mask making patterns, each of which is present on a square of 0.1 mm. These nine patterns have different sizes. When viewed down, the pyramidal bump has a shape depicted by nine contour lines. In FIGS. 12-1 to 12-9, the shaded portions shield light.

In a mask making pattern, twelve sets of the same patterns are arranged in a (3×4) matrix. The patterning step is performed by sequentially changing each of the mask making patterns. The patterning and etching steps are alternately repeated nine times using each of the nine patterns.

The ECR etching step is performed under the following conditions: a bell jar pressure of 3×10$^{-4}$ Torr; introduction of 10 sccm of CCl$_4$ gas; and an output power of 450 W. An etching rate is 15 Å/minute. Therefore, the etching step is performed for ten minutes so as to accomplish an etching depth of 150 Å, for example.

The gradation mask formed by the foregoing steps has the transmittance which varies in ten steps with respect to an i-ray (having wavelength of 365 nm) of a mercury lamp.

This gradation mask is used to form an array of pyramidal bumps.

"POSI-RESIST" OFPR-800 (trade name) is applied on a transparent synthetic quartz substrate to a thickness of 18 μm, and then is prebaked, thereby forming the photoresist layer. The substrate is used as an optical element for forming an array of pyramidal bumps. The foregoing gradation mask is aligned to the photoresist layer on the substrate with a minute space kept therebetween. The photoresist layer is exposed via the gradation mask in a defocused state with light illumination of 2000 mj/cm$^2$, and is then developed and rinsed.

Photoresist bumps formed by the foregoing step have the surface profile which is smoothed because of the exposure of the gradation mask in the defocused state, and has a height of 14.1 μm. The surface profile of the photoresist bumps is the same as that of the pyramidal bumps to be formed. The height of 14.1 μm is smaller than the original thickness of 18 μm. This is because the transmittance of 0% of the chromium oxide layers on the gradation mask cannot be accomplished. The photoresist is slightly sensitive to light at a portion where the transmittance is minimum, and is slightly removed.

The synthetic quartz substrate with the foregoing photoresist bumps is ECR-etched for 160 minute under the following conditions: a bell jar pressure of 5.5×10$^{-4}$ Torr; introduction 25 sccm of CF$_4$ gas; and an output power of 450 W. The profile of the photoresist bumps is replicated onto the synthetic quartz substrate. The substrate has desired pyramidal bumps which are arranged in the (3×4) matrix.

EXAMPLE 3

A transparent synthetic quartz substrate for a gradation mask is cleaned, and is placed in the planar magnetron sputtering apparatus, and is subjected to the RF reverse sputtering for ten minutes under the following conditions: introduction of 30 sccm of Ar gas; a bell jar pressure of 12 mTorr; and an effective power of 85 W.

The substrate is DC-sputtered for 26 minutes using metallic chromium as a target material under the following conditions: introduction of 10 sccm of nitride gas and 20 sccm of carbonic acid gas; a bell jar pressure of 6.5 mTorr; and an output current of 1.1 A.

The obtained chromium compound film (chromium oxide nitride film) is 3000 Å thick. Amounts of nitride, oxide and carbon in the chromium compound are in the ratio of 0.1 : 2.1 : 0.3, where an amount of chromium atom is assumed to be 1.

Aligning patters are formed similarly to those in Example 1.

The first to fifteenth mask making patterns as in Example 1 are used to form a surface profile on the gradation mask. However, contrary to Example 1, the fifteenth pattern (shown in FIG. 11–15) is used first, followed by the fourteenth pattern (FIG. 11–14), thirteenth pattern (FIG. 11–13), . . . first pattern (FIG. 11-1) as shielding patterns.

The etching step is performed by ECR-etching under the following conditions: a bell jar pressure of 3×10$^{-4}$ Torr; introduction of 10 sccm of CCl$_4$ gas; an etching rate of 12 Å/min; and an effective power of 450 W. For example, the ECR etching step is performed for 12.5 minutes so as to etch the gradation mask to a depth of 150 Å.

The gradation mask has 12 layers each of which has a stepwise varying thickness, and the transmittance varying in 16 levels with respect to i-ray (having wavelength of 365 nm) of a mercury lamp.

In order to smooth the stepwise varying thickness, the gradation mask is DC-sputtered for four minutes under the following conditions: use of a metallic chromium as a target material; introduction of 10 sccm of nitride gas, and 20 sccm of carbon acid gas; a bell jar pressure of 10 mTorr; and an output current of 1.1 A. The profile of the layers is smoothed. Since an additional chromium compound layer is slightly present on the synthetic quartz substrate, the gradation mask is further ECR-etched for 6.5 minutes under the foregoing conditions. Thus, the surplus chromium compound layer is completely etched on an area where the synthetic quartz substrate should be uncovered. The gradation mask had the transmittance continuously varying between 92% to 5%, and also has the smoothed profile of layers.

The gradation mask is used to form microlenses constituting a microlens array as in the example 1.

As photoresist, "POSI-RESIST" OFPR-800 is applied onto a synthetic quartz substrate, for constituting a microlens array, to a thickness of 20 μm, and is prebaked. Then, the foregoing gradation mask is closely contacted with the photoresist on the synthetic quartz substrate. The photoresist is exposed via the gradation mask with a light amount of 2500 mj/cm$^2$, and is developed and rinsed. A profile of the photoresist bumps on the substrate is the same as the target profile of the microlenses to be formed. Each photoresist bump is 20 μm high.

The substrate is placed in an ECR etching apparatus, and is etched for 200 minutes under the following conditions: a bell jar pressure of $5.5 \times 10^{-4}$ Torr; introduction of 25 sccm of $CF_4$ gas; and an output power of 450 W. The profile of the bumps is replicated onto the substrate.

EXAMPLE 4

A transparent synthetic quartz substrate for a gradation mask is cleaned, is placed in a planar magnetron sputtering apparatus, and is subject to the RF reverse sputtering for ten minutes under the following conditions: introduction of 30 sccm of Ar gas; a bell jar pressure of 12 mTorr, and an effective power of 85 W.

To make a chromium compound film on the synthetic quartz substrate, DC-sputtering is performed for 25 minutes under the following conditions: use of metallic chromium as a target material; introduction of 0 to 10 sccm of oxygen gas, and 20 to 30 sccm of Ar gas; a bell jar pressure of 6.5 mTorr; and an output current of 1.1 A.

In the foregoing step, an MFC (mass flow controller) is programmed such that an amount of oxygen is increased as the chromium compound film becomes thicker, the oxygen becomes maximum when the chromium compound film is 1250 Å, and the oxygen is gradually reduced as the chromium compound film becomes further thicker. In other words, the amount of oxygen is maximum at the middle thickness portion of the chromium compound film.

The chromium compound film (chromium oxide film) is 2500 Å thick. An amount of oxygen in the chromium compound film is 0 to 1.1 with respect to one chromium atom.

Aligning patterns are made as in Example 1.

In each patterning step, nine mask making patterns (shown in FIG. 12-1 to 12-9) are used one after another. The patterning and etching steps are alternately repeated nine times as in the example 2.

The ECR-etching step is performed under the following conditions: a bell jar pressure of $3 \times 10^{-4}$ Torr; introduction of 10 sccm of $CCl_4$ gas; and an output power of 450 W. The etching rate is 18 Å/minute. For example, the substrate and chromium compound film is etched for 8.3 minutes to a depth of 150 Å.

Thus, each chromium compound layer of obtained gradation mask has a stepwise varying thickness, and the transmittance varying in ten levels with respect to i-rays (having wavelength of 365 nm) of the mercury lamp.

In order to smooth the stepwise varying thickness of layers, the gradation mask is DC-sputtered for four minutes under the following conditions: use of metallic chromium as a target material; introduction of 20 sccm of oxygen gas and 10 sccm of Ar gas; a bell jar pressure of 6.5 mTorr; and an output current of 1.1 A. Thus, the gradation mask has the smoothly varying pyramidal surfaces. A surplus chromium oxide layer remaining on the synthetic quartz substrate is removed by the ECR etching for 6.5 minutes under the foregoing conditions.

Next, an anti-reflection layer is formed on the substrate opposite to the chromium oxide layers. Therefore, the gradation mask has the smoothly varying pyramidal surfaces, and the transmittance smoothly varying in a range of 95% to 5%.

This gradation mask is used to form an array of pyramidal profile. As photoresist, "POSI-RESIST" OFPR-800 is applied on a synthetic quartz substrate to a thickness of 20 µm, and is prebaked. The gradation mask is closely contacted with the photoresist. The photoresist is exposed via the gradation mask with light of 2500 mj/cm², and is developed and rinsed. The profile of the layers on the gradation mask is replicated onto the photoresist (on the quartz substrate). The photoresist is 16.0 µm high, and has the profile which is the same as a target profile to be formed as an array of pyramidal bumps.

The quartz substrate with the pyramidal bumps of the photoresist is ECR-etched for 180 minutes under the following conditions: a bell jar pressure of $5.5 \times 10^{-4}$ Torr; 25 sccm of $CF_4$ gas; and an output power of 450 W.

Thus, a 3×4 array of pyramidal bumps (shown in FIG. 12-0) is formed on the synthetic quartz substrate.

EXAMPLE 5

As photoresist, "POSI-RESIST" OFPR-800 is applied on a transparent synthetic quartz substrate (for a gradation mask) to a thickness of 2 µm, and is prebaked. The photoresist on the synthetic quartz substrate is exposed via a separate mask for making aligning patterns, and is developed and rinsed. A photoresist pattern in which the photoresist is absent in accordance with the shape of the aligning patterns is obtained.

A chromium layer is formed over the photoresist and the quarts substrate under the following conditions.

The quartz substrate is placed in a planar magnetron sputtering apparatus, and is subject to the RF reverse sputtering for 10 minutes, with the introduction of 30 sccm of Ar gas, a bell jar pressure of 12 mTorr, and an effective power of 85 W. On the substrate, the photoresist slightly left at the area where aligning patterns will be formed is completely removed such that a chromium film is in close contact with the quartz substrate in the succeeding sputtering step.

The quartz substrate with photoresist layer is DC-sputtered for ten minutes under the following conditions: use of metallic chromium as a target material; introduction of 30 sccm of Ar gas; a bell jar pressure of 6.5 mTorr; and an output current of 1.1 A. An obtained chromium layer is approximately 800 Å thick. The quartz substrate is then immersed in a photoresist-releasing solution so as to remove the photoresist and the chromium layer thereon by a lift-off process. Thus, only the aligning patterns of chromium layer are left on the quartz substrate.

In the following steps, the aligning patterns and mask making patterns are aligned similarly to the foregoing examples.

Negative photoresist is used in the patterning step. Nine mask making patterns used in Example 2 are used. The pattern shown in FIG. 12-1 is used first of all. A negative photoresist mask is formed, and a thin chromium film is formed by sputtering as the aligning patterns. The negative photoresist mask with the chromium film thereon is then removed by the lift-off process, and the elementary films of chromium are left on the substrate.

The patterning step and the film forming step are alternately repeated nine times by using different mask making patterns.

The formed gradation mask has 12 chromium layers arranged in 3×4 matrix. Each layer has a stepwise varying thickness, and a transmittance varying in ten levels between 0% to 100% with respect to i-rays (having wavelength of 365 nm) of the mercury lamp.

Stepwise form of the layers of the gradation mask is smoothed by the DC sputtering for four minutes under the following conditions: use of metallic chromium as a target material; introduction of 30 sccm of Ar gas; a bell jar pressure of 10 mTorr; and an output current of 1.1 A.

When the layers are smoothed, a surplus chromium film is slightly formed on the quartz substrate. This surplus chromium layer is removed by the ECR etching for 6.5 minutes under the same conditions as those mentioned above. Thus, the surplus chromium layer is completely etched at an area where relative transmittance is 100% (which is equal to the transmittance of the synthetic quartz substrate itself). The gradation mask has the transmittance smoothly varying between 0% and 100%.

This gradation mask is used to form an array of pyramidal bumps on a synthetic quartz substrate. As photoresist, "POSI-RESIST" OFPR-800 is applied on the synthetic quartz substrate to a thickness of 20 µm, and is prebaked. The gradation mask is closely contacted with the photoresist on the quartz substrate. The photoresist is exposed with light of 2500 mj/cm$^2$, and is developed and rinsed.

The photoresist has a profile which is the same as an array of pyramidal bumps as the final profile.

The quartz substrate with photoresist bumps is ECR-etched for 210 minutes under the following conditions: a bell jar pressure of $5.5 \times 10^{-4}$ Torr; introduction of 25 sccm of $CF_4$ gas; and an output current power of 450 W. The profile of the photoresist bumps is replicated onto the quartz substrate.

The quartz substrate has an array of desired pyramidal bumps thereon.

EXAMPLE 6

Figure 8:
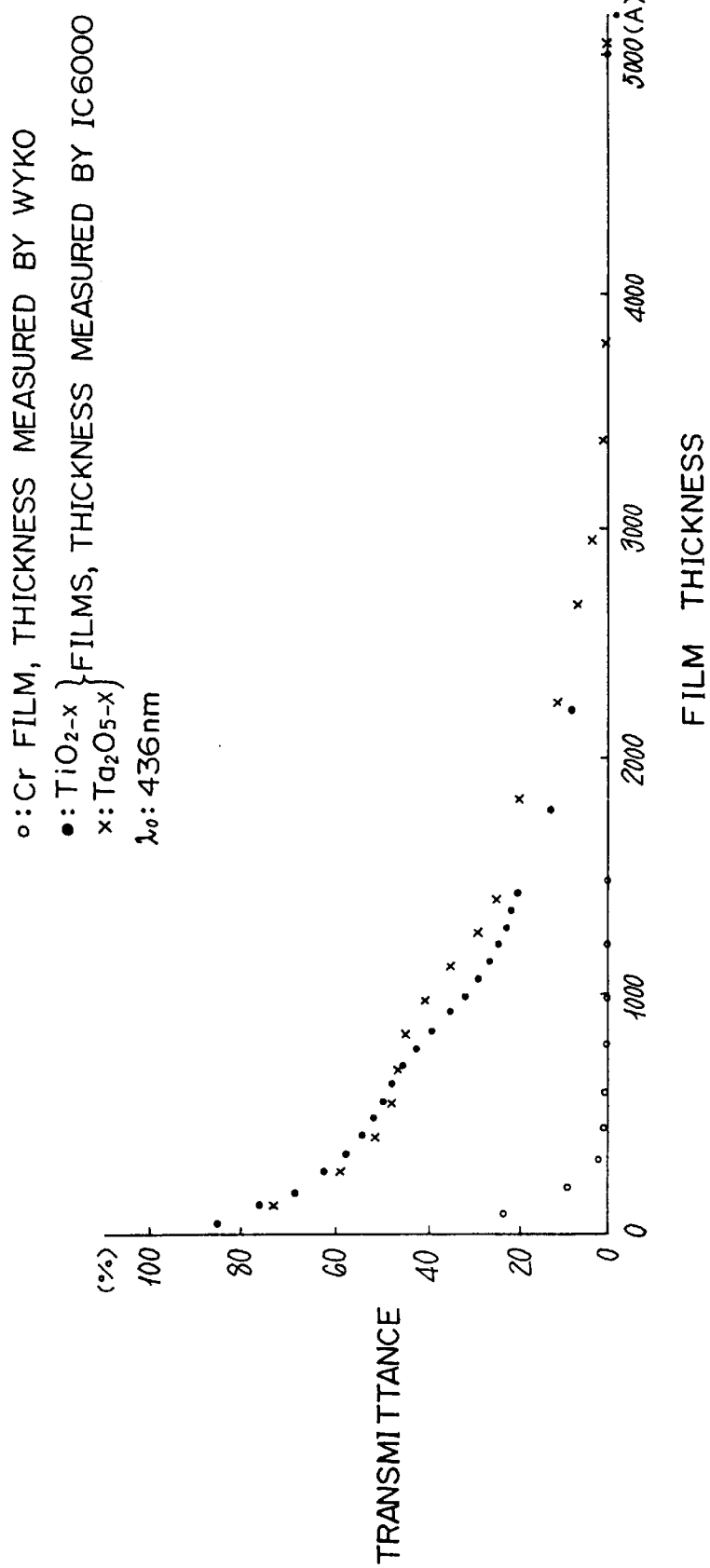
FIG. 8 shows the relationship between transmittance and thicknesses of a chromium film, a titanium oxide film, and a tantalum oxide film.

An oxide titanium (TiO) film is formed on a high purity synthetic quartz substrate by a metallizing technique. The relationship between a thickness and transmittance of the oxide titanium ($TiO_{2-x}$) film was examined by applying g-rays (having the wavelength of 436 nm) of a mercury lamp irradiating ultra violet light, as shown in FIG. 8. For comparison, the relationship between the thickness and transmittance of an oxide tantalum ($Ta_2O_{5-x}$) film is also shown in FIG. 8. The transmittance of the oxide titanium film varies extensively, but varies slightly depending upon a variation of thickness thereof, compared with the chromium film. Therefore, the transmittance can be easily controlled.

FIG. 9 shows the relationship between a thickness of the titanium oxide film and a thickness of removed photoresist after exposed via the film. This relationship is obtained as follows. "POSI-RESIST" OFPR-800 as photoresist is exposed via the titanium oxide film of different thickness by light of 2500 mj/cm$^2$. The relationship between an amount of exposure light and the thickness of removed photoresist is the same as those shown in FIG. 7.

In this example, the gradation mask is formed as follows. A chromium layer is used to form aligning patterns on a transparent synthetic quartz substrate. Then, a desired metal oxide film (or a combination of a metal oxide layer and a metal layer) is applied on the substrate.

First of all, the transparent synthetic quartz substrate is cleaned, is placed in the planar magnetron sputtering apparatus, and is subject to the RF reverse sputtering for ten minutes under the following conditions: introduction of 30 sccm of Ar gas; a bell jar pressure of 12 mTorr; and an effective power of 85 W.

The substrate is then DC-sputtered for 24 minutes under the following conditions: use of metallic chromium as a target material; introduction of 30 sccm of the Ar gas; a bell jar 6.5 mTorr; and an output current of 1.1 A. The obtained chromium film is 2000 Å thick, and has a transmittance of 0%. This chromium layer is used for aligning patterns.

The aligning patterns are formed as in the foregoing Examples.

Titanium oxide tablets are put in an oxide-free copper crucible, which is placed in a metallizer (BMC-800) (manufactured by Vacuum Device Co., Ltd.). After being degassified to prevent the sudden boiling, titanium oxide is fused, and is then cooled.

The synthetic quartz substrate, which is masked at areas corresponding to the aligning patterns of chromium layer, is metallized for 32 minutes under the following conditions: use of titanium oxide as a target material; and a bell jar pressure of $1.0 \times 10^{-5}$ Torr. The obtained titanium oxide film is 2200 Å thick, and has a transmittance of 8.5%. The synthetic quartz substrate has a transmittance 92.0% before metallizing the titanium oxide layer.

The metallized substrate is further metallized by chromium (prepared in a separate copper crucible) to a thickness of 500 Å. Thus, the substrate has a transmittance of 0%. The substrate metallized with titanium oxide and chromium is covered with anti-reflection layer on its non-metallized surface.

"POSI-RESIST" OFPR-800 as photoresist is applied on the chromium film stacked on the titanium oxide film except for the aligning patterns of the chromium layer, and is prebaked. The photoresist is aligned with patterns mating aligning patterns, exposed, developed and rinsed (a patterning step).

In the patterning step, the fifteen mask making patterns (shown in FIGS. 11-1 to 11-15) are also used similarly to the Example 1.

The metal oxide film (with the titanium oxide film and the chromium film thereon) is etched to a desired depth (equal to a step thickness) using the photoresist pattern as a mask.

In the case of dry-etching, the ECR etching, RIE etching and TCP etching are usable. The ECR etching is especially preferable.

In this example, the ECR etching step is performed under a bell jar pressure of $3 \times 10^{-4}$ Torr, an output power of 450 W, and an etching rate of 22.5 Å/minute. The titanium oxide film is etched by introducing 7 sccm of a $CCl_4$ gas while the chromium film is etched by introducing 7 sccm of the $CCl_4$ gas. For example, the titanium oxide film may be etched for 6 minutes to a depth of 150 Å, while the chromium film may be etched for 6.7 minutes to the depth of 150 Å.

The etching rates of the metal oxide film (titanium oxide film) and metal film (chromium film) are measured beforehand. The etched depths are controlled by adjusting an etching period. The dry-etching rate is 10 to 30 Å/minute, which is rather small, and is preferable to precisely control the thickness of the metal oxide or metal film.

This gradation mask has a stepwise varying thickness, and a transmittance which varies in 16 steps (including the transmittances 92 and 0%) with respect to g-rays (having the wavelength of 436 nm) of the mercury lamp.

A microlens array (shown in FIG. 10) is formed using the foregoing gradation mask.

"POSI-RESIST" OFPR-800 is applied to a thickness of 15 µm on a synthetic quartz substrate as a microlens array material, and is prebaked. The foregoing gradation mask is closely contacted with the photoresist. The photoresist is exposed via the foregoing gradation mask with light of 2500 mJ/cm$^2$, and is developed and rinsed. Photoresist bumps formed on the substrate have a thickness varying in accordance with the stepwise varying transmittance of the gradation mask. The photoresist bumps are then post-baked for 20 minutes at 150° C. The stepwise varying portion of the photoresist bumps is thermally smoothed. The photoresist bumps have a height of 16.2 μm, and had a thickness varying smoothly.

The foregoing substrate with the photoresist bumps is placed in the ECR etching apparatus, and is etched for 170 minutes under the following conditions: a bell jar pressure of $5.5 \times 10^{-4}$ Torr; introduction of 25 sccm of the $CF_4$ gas; and an output power of 450 W. The smoothed surface profile of the photoresist bumps is replicated on the substrate.

A number of microlens arrays are successfully produced at a reduced cost using the gradation masks repeatedly. The obtained microlenses have a precisely controlled profile. The gradation mask can be suitably used for mass-production of microlenses.

EXAMPLE 7

A gradation mask is produced as follows. As a metal oxide film, a titanium oxide film is formed on a transparent synthetic quartz substrate as a gradation mask material. In other words, the titanium oxide film is vacuum-evaporated for 33 minutes under the following conditions: use of titanium oxide ($TiO_2$) as a target material; and a bell jar pressure of $1.0 \times 10^{-5}$ Torr. The obtained titanium oxide film is 2300 Å thick, and has a transmittance of 8.5%. The synthetic quartz substrate has a transmittance of 92.0% before the vacuum evaporation.

FIGS. 6A and 6B shows the relationship between the thickness of the film and transmittance. The synthetic quartz substrate is covered with an anti-reflection layer on the surface opposite to the metal oxide layer. Aligning patterns are similarly formed to those in Example 1.

In the patterning step, the nine mask making patterns in Example 2 (shown in FIGS. 12-1 to 12-9) are used.

The ECR-etching is performed under the following conditions: a bell jar pressure of $3 \times 10^{-4}$ Torr; introduction of 7 sccm of the $CCl_4$ gas; and an output power of 450 W. The etching rate is 22.5 Å/minute. This means that, for example, it takes 6.7 minutes to etch the gradation mask to a depth of 150 Å.

The patterning step and the etching step are alternately repeated nine times using the nine different mask making patterns. The obtained gradation mask has 12 layers with a stepwise varying thickness and a transmittance varying in ten steps with respect to g-rays (having a wavelength of 436 nm) of a mercury lamp.

In order to smooth the stepwise varying portions of layers, the gradation mask is metallized for five minutes under a bell jar pressure of $5.0 \times 10^{-5}$ Torr. Thus, the transmittance is continuously smoothed, but a surplus titanium oxide layer is slightly formed on the synthetic quartz substrate. This surplus titanium oxide layer is removed by ECR-etching for 6.5 minutes under the same conditions as those mentioned above. In Example 7, the gradation mask does not have an area with the transmittance 0% because it has a single layer structure of the titanium oxide layer which is not sufficiently thick.

An array of pyramidal bumps are formed using the foregoing gradation mask. "POSI-RESIST" OFPR-800 as photoresist is applied on a synthetic quartz substrate as an optical material, and is prebaked. The gradation mask is closely contacted with the photoresist. The photoresist is exposed via the gradation mask with light of 2500 mJ/cm², and is developed and rinsed. The profile formed of the photoresist is pyramidal bumps (as shown in FIG. 12-0) in the (3×4) matrix. Due to the absence of the area having the transmittance 0% in the gradation mask, the photoresist had a height of 7 μm which is slightly smaller than the original height.

The substrate with the pyramidal photoresist bumps is ECR-etched for 75 minutes under the following conditions: a bell jar pressure of $5.5 \times 10^{-4}$ Torr; introduction of 25 sccm of the $CF_4$ gas; and an output power of 450 W. Thus, the surface profile of the photoresist bumps is replicated on the synthetic quartz substrate.

Thus, the optical element having an array of pyramidal bumps of the desired shape is obtained.

EXAMPLE 8

A metal oxide film is vacuum-evaporated on a transparent synthetic quartz substrate as a gradation mask material, using the same vacuum-evaporation apparatus as that in Example 6. Aligning patterns are formed as in Example 1.

The synthetic quartz substrate is vacuum-evaporated for 28 minutes using tantalum pentaoxide $Ta_2O_5$ as a target material and under a bell jar pressure of $1.0 \times 10^{-5}$ Torr. The tantalum pentaoxide film is 3800 Å thick, and has the transmittance 0%. The synthetic quartz substrate has transmittance 92.0% before the vacuum evaporation. FIG. 8 shows the relationship between the thickness and transmittance of the tantalum pentaoxide film. An anti-reflection layer is formed, by the vacuum evaporation, on the substrate on the surface opposite to the tantalum pentaoxide layer.

In the patterning step, the fifteen mask making patterns used in Example 1 are also used.

The ECR-etching step is performed under the following conditions: a bell jar pressure of $3 \times 10^{-4}$ Torr; introduction of 5 sccm of the $CF_4$ gas; and an output power of 450 W. The etching rate is 39.6 Å/minute. For example, the substrate is etched to a depth of 150 Å for approximately 3.8 minutes.

The patterning step and the etching step are alternately repeated 15 times using 15 different mask making patterns. The obtained gradation mask has 3×4 layers (bumps) with a stepwise varying thickness, and transmittance varying in 16 steps with respect to g-rays (having the wavelength of 436 nm) of the mercury lamp.

In order to smooth the stepwise varying thickness, the gradation mask is vacuum-evaporated for 3 minutes using tantalum oxide as a target material under a bell jar pressure of $1.0 \times 10^{-5}$ Torr. The stepwise varying thickness is smoothed on the gradation mask. However, a surplus tantalum oxide layer is slightly formed on the synthetic quartz substrate. In order to remove this surplus tantalum oxide layer, the substrate is ECR-etched for 10 minutes under the same conditions as those described above.

A microlens array (shown in FIG. 10) is formed using this gradation mask.

Specifically, "POSI-RESIST" OFPR-800 as photoresist is applied, to a thickness of 13 μm, on a synthetic quartz substrate as a microlens array material, and is prebaked. The synthetic quartz substrate with photoresist is closely contacted with the foregoing smoothed gradation mask, is exposed with light of 2500 mJ/cm², and is developed and rinsed. Photoresist bumps obtained on the synthetic quartz substrate have a height of 14.0 μm, and a surface profile identical to the target shape of the microlens.

The synthetic quartz substrate with the photoresist bumps are ECR-etched for 150 minutes under the following conditions: a bell jar pressure of $5.5 \times 10^{-4}$ Torr; introduction of 25 sccm of the $CF_4$ gas; and an output power of 450 W. The surface profile of the photoresist is replicated onto the synthetic quartz substrate as the microlens array.

EXAMPLE 9

A transparent synthetic quartz substrate as a gradation mask material is placed in the vacuum evaporation apparatus as in Example 6. The substrate is vacuum-evaporated for 34 minutes using tantalum pentaoxide $Ta_2O_5$ as a target material under a bell jar pressure of $1.0 \times 10^{-5}$ Torr.

In this step, an amount of introduced oxide is gradually increased as the metal oxide film becomes thicker. The amount of oxide is maximum when the metal oxide film is 1900 Å thick. Thereafter, oxide is gradually reduced as the metal oxide film becomes further thicker. A mass flow controller MFC is programmed so as to control the amount of oxide to be introduced as described above. Aligning patterns are similarly formed to those in Example 1.

The tantalum pentaoxide film is 3800 Å thick, and has a transmittance of 0%. The synthetic quartz substrate itself has the transmittance 92.0%. Then, an anti-reflection layer is vacuum-evaporated on the substrate opposite to the tantalum pentaoxide film.

The nine mask making patterns used in Example 2 are also used in the patterning step. In the etching step, the synthetic quartz substrate with the tantalum pentaoxide film is ECR-etched under the following conditions: a bell jar pressure of $3 \times 10^{-4}$ Torr; introduction of 5 sccm of the $CF_4$ gas; and an output power of 450 W. The etching rate is 29.3 Å/minute on the average. For example, the substrate is etched to a depth of 150 Å for approximately 5.1 minutes.

The patterning step and the etching step are alternately repeated nine times using nine different mask making patterns. The obtained gradation mask has a transmittance which varies in ten steps with respect to grays (having the wavelength of 436 nm) of the mercury lamp, in accordance with the stepwise varying portions of the tantalum pentaoxide layers.

An array of pyramidal bumps is formed on a synthetic quartz substrate using the foregoing gradation mask. Specifically, "POSI-RESIST" OFPR-800 as photoresist is applied to a thickness of 13 $\mu$m on the synthetic quartz substrate, and is prebaked. Next, the substrate having photoresist is aligned with the foregoing gradation mask with a slight space kept therebetween, is exposed via the gradation mask in a defocused state with light of 2500 mJ/cm$^2$, and is developed and rinsed. The smoothed photoresist bumps are formed on the substrate. Each bump is 14.0 $\mu$m high, and is identical to the target surface profile (i.e. pyramidal bump).

Then, the synthetic quartz substrate with photoresist bumps is ECR-etched for 150 minutes under the following conditions: a bell jar pressure of $5.5 \times 10^{-4}$ Torr; introduction of 25 sccm of the $CF_4$ gas; and an output power of 450 W.

Thus, the profile of the photoresist bumps is replicated onto the synthetic quartz substrate.

According to the present invention, it is also possible to form gradation masks for producing color filters whose transmittance varies 0%, 10% and 100%. Therefore, the invention also covers gradation filters for producing color filters.

[Advantageous Results]

The invention can provide gradation masks whose transmittance varies in a stepwise manner or smoothly.

The gradation mask can have transmittance which increases or decreases in a simple manner, transmittance which has maximum and minimum values, that is, transmittance which increases, decreases and increases, or transmittance which varies via an inflection point.

The gradation masks can be reliably and easily formed according to the described methods.

Further, the foregoing method enables desired profiles to be formed on the photoresist using the gradation masks. The profiles on the photoresist are replicated on the substrate.

What is claimed is:

1. A method of forming a microlens pattern on a transparent substrate comprising:

applying a photoresist material to a substrate;

exposing said photoresist material to a pattern of light;

developing said photoresist material; and etching said substrate and said photoresist material, wherein said pattern of light is produced by a gradation mask placed between a light source and the photoresist material, and wherein said gradation mask comprises a transparent substrate and a metal and/or metallic compound on said substrate, wherein the metal and/or metallic compound is in the form of a group of layers, each of which has a thickness $Z(X, Y)$ varying in three or more steps in accordance with a desired distribution of transmittance in a two-dimensional region expressed by coordinates X and Y.

2. A gradation mask comprising a transparent substrate and metal and/or metallic compound on the substrate, wherein the metal and/or metallic compound is in the form of a group of layers, each of which has a thickness $Z(X, Y)$ varying in three or more steps in accordance with a desired distribution of transmittance in a two-dimensional region expressed by coordinates X and Y.

3. The gradation mask according to claim 2, further comprising an anti-reflection layer on at least one surface thereof.

4. A method for forming special surface profiles on a material, comprising:

applying photoresist to a predetermined thickness on a substrate where the special surface profiles are to be formed;

exposing the photoresist via the gradation mask defined in claim 2 so as to stepwise vary a thickness of the photoresist in accordance with the special surface profiles;

thinly applying photoresist on the photoresist so as to smooth stepwise portions; and anisotropically etching the photoresist and the substrate so as to transfer the special surface profiles of the photoresist onto the substrate.

5. A gradation mask comprising a transparent substrate and metal and/or metallic compound on the substrate, wherein the metal and/or metallic compound is in the form of a group of layers, each of which has a thickness $\xi(X, Y)$ continuously varying in accordance with a desired distribution of transmittance in a two-dimensional region expressed by coordinates X and Y.

6. The gradation mask according to claim 2 or 5, wherein the metallic compound is chromium compound or metal oxide.

7. The gradation mask according to claim 6, wherein the metal oxide which forms the layers is titanium oxide, tantalum oxide, silicon oxide, chromium oxide, aluminum oxide, tungsten oxide, tin oxide, indium oxide, or a combination of two or more materials selected from the foregoing materials.

8. The gradation mask according to claim 2 or 5, wherein the metal which forms the layers is titanium, tantalum, silicon, chromium, aluminum, tungsten, tin or indium.

9. The gradation mask according to claim 2 or 5, wherein each layer of a group of layers is formed by stacking a plurality of the thin film of metal defined in claim 8 and the thin film of metal oxide in claim 7.

10. The gradation mask according to claim 2 or 5, wherein each layer of a group of layers is formed of any of chromium, chromium oxide, chromium nitride, chromium oxide nitride, or chromium nitride carbonate oxide, or is formed by stacking two or more thin films of a material selected from the foregoing materials.

11. A method for forming special surface profiles on a material, comprising:
 applying photoresist to a predetermined thickness on a substrate where the special surface profiles are to be formed;
 exposing the photoresist via the gradation mask defined in claim 5 so as to continuously vary a thickness of the photoresist in accordance with the special surface profiles; and
 anisotropically etching the photoresist and the substrate so as to transfer the special surface profiles of the photoresist onto the substrate.

12. A method for forming a gradation mask, comprising:
 uniformly forming a film of metal and/or metallic compound on a transparent substrate so as to assure a transmittance of 10% or less (film forming step);
 forming a mask pattern for attaining desired shapes onto the film of the metal and/or metallic compound (patterning step); and
 dry- or wet-etching the film of the metal and/or metallic compound using the formed mask pattern as a mask (etching step),
 wherein the patterning step and the etching step are alternately repeated as desired by forming different masks so as to produce a gradation mask with a group of layers in which each layer of the metal and/or metallic compound has a thickness $Z(X, Y)$ varying stepwise in three or more steps in accordance with a desired distribution of transmittance.

13. The method according to claim 12, further comprising treatment for smoothing the layers of the metal and/or metallic compound having the thickness varying in three or more steps such that each of the layers of the metal and/or metallic compound has a smoothly varying thickness $g(X, Y)$.

14. The method according to claim 13, wherein the smoothing treatment is performed by exposing the mask making pattern in a defocused state during the patterning step.

15. The method according to claim 13, wherein the smoothing treatment is performed by thermally treating the masks after the patterning step so as to smooth edges of masks, and by dry-etching in the etching step.

16. The method according to claim 13, wherein the smoothing treatment is performed by an isotropic dry- or wet-etching in the etching step.

17. The method according to claim 13, wherein the smoothing treatment is performed by thinly applying photoresist on the layers having the stepwise varying thickness $Z(X, Y)$ as defined in claim 12 so as to fill stepwise portions, and by etching the applied photoresist and the layers with a selection rate of 1.

18. The method according to claim 13, wherein the smoothing treatment is performed by thinly applying a metal and/or metallic compound on the layers having the stepwise varying thickness $Z(X, Y)$ as defined in claim 12, and by performing the dry- or wet-etching.

19. A method for forming a gradation mask, comprising:
 forming a mask with a negative pattern for attaining desired shapes on a transparent substrate (patterning step); and
 uniformly forming a group of elementary films of metal and/or metallic compound on the substrate using the mask (film forming step),
 wherein the patterning and film forming steps are alternately repeated as desired by forming different masks so as to form a group of layers by stacking the elementary films on the substrate, and each layer has a thickness $Z(X, Y)$ varying in accordance with a desired distribution of transmittance.

20. The method according to claim 19, further comprising treatment for smoothing the stepwise varying thickness of the layers such that the layers have a continuously varying thickness $\xi(X, Y)$.

21. The method according to claim 20, wherein the smoothing treatment is performed by exposing a mask making pattern with negative patterns in a defocused state during the patterning step.

22. The method according to claim 20, wherein the smoothing treatment is performed by thinly applying photoresist on the layers having the stepwise varying thickness $Z(X, Y)$ as defined in claim 19 so as to fill stepwise portions, and by etching the layers carrying the photoresist thereon with a selection rate of 1.

23. The method according to claim 20, wherein the smoothing treatment is performed by thinly applying a metal and/or metallic compound on the layers having the stepwise varying thickness $Z(X, Y)$ as defined in claim 19, and by performing the dry- or wet-etching.

24. A method for forming special surface profiles on a material, comprising:
 applying photoresist to a predetermined thickness on a substrate where the special surface profiles are to be formed;
 exposing the photoresist via the gradation mask defined in claim 2 in a defocused state so as to vary a thickness of the photoresist in accordance with the special surface profiles; and
 anisotropically etching the photoresist and the substrate so as to transfer the special surface profiles of the photoresist onto the substrate.

25. A method for forming special surface profiles on a material, comprising:
 applying photoresist to a predetermined thickness on a substrate where the special surface profiles are to be formed;
 exposing the photoresist via the gradation mask defined in claim 2 so as to stepwise vary a thickness of the photoresist in accordance with the special surface profiles;
 thermally deforming the photoresist so as to smooth the stepwise varying thickness of the photoresist; and
 anisotropically etching the photoresist and the substrate so as to transfer the special surface profiles of the photoresist onto the substrate.

* * * * *

UNITED STATES PATENT AND TRADEMARK OFFICE
CERTIFICATE OF CORRECTION

PATENT NO. : 5,830,605
DATED : November 3, 1998
INVENTOR(S) : Kazuhiro UMEKI, et al.

It is certified that error appears in the above-indentified patent and that said Letters Patent is hereby corrected as shown below:

On the title page, item [54], and on top of column one, a comma is missing in the title. It should be:

--[54] GRADATION MASK, METHOD OF PRODUCING ..........--

Signed and Sealed this

Twenty-fifth Day of May, 1999

*Attest:*

Q. TODD DICKINSON

*Attesting Officer*     Acting Commissioner of Patents and Trademarks